United States Patent
Arakawa

(10) Patent No.: US 6,822,476 B2
(45) Date of Patent: Nov. 23, 2004

(54) LOGIC CIRCUIT WHOSE POWER SWITCH IS QUICKLY TURNED ON AND OFF

(75) Inventor: Fumio Arakawa, Kodaira (JP)

(73) Assignee: Renesas Technology Corporation, Tokyo (JP)

( * ) Notice: Subject to any disclaimer, the term of this patent is extended or adjusted under 35 U.S.C. 154(b) by 3 days.

(21) Appl. No.: 10/347,476

(22) Filed: Jan. 21, 2003

(65) Prior Publication Data

US 2003/0137321 A1 Jul. 24, 2003

(30) Foreign Application Priority Data

Jan. 23, 2002 (JP) .................................. P2002-014360

(51) Int. Cl.⁷ ...................... H03K 17/16; H03K 19/003; H03K 19/0175; H03K 19/094
(52) U.S. Cl. ........................................ 326/21; 326/68
(58) Field of Search .............................. 326/21, 26, 81, 326/68; 361/111; 365/227; 363/43, 98; 232/287; 320/132

(56) References Cited

U.S. PATENT DOCUMENTS

| | | | | |
|---|---|---|---|---|
| 4,203,151 A | * | 5/1980 | Baker | ........................... 363/43 |
| 4,236,089 A | * | 11/1980 | Baker | ........................... 327/483 |
| 4,270,163 A | * | 5/1981 | Baker | ........................... 363/43 |
| 5,319,260 A | * | 6/1994 | Wanlass | ....................... 326/26 |
| 5,486,774 A | | 1/1996 | Douseki et al. | |
| 5,614,847 A | | 3/1997 | Kawahara et al. | |
| 5,933,384 A | * | 8/1999 | Terada et al. | ................ 365/227 |
| 6,011,681 A | * | 1/2000 | Ker et al. | .................... 361/111 |
| 6,242,948 B1 | * | 6/2001 | Makino | ........................ 326/81 |
| 6,504,400 B2 | * | 1/2003 | Tanaka et al. | ................. 326/68 |
| 6,531,886 B1 | * | 3/2003 | Eichfeld et al. | ............... 326/21 |

FOREIGN PATENT DOCUMENTS

| | | |
|---|---|---|
| JP | 5-291929 | 11/1993 |
| JP | 6-29834 | 2/1994 |
| JP | 7-86916 | 3/1995 |

* cited by examiner

*Primary Examiner*—Patrick Wamsley
(74) *Attorney, Agent, or Firm*—Mattingly, Stanger & Malur, P.C.

(57) ABSTRACT

The present invention is to provide a logic circuit which assures short-circuit current reduction by using a gate which uniquely fixes the level of each node and also reduces leakage current so that the power is turned on and off quickly. Logic gates of the subject logic circuit are divided into first-type logic gate and second-type logic gates. The first-type logic gate outputs high potential under the specific status and the second-type logic gate outputs low potential under the specific status. Under the state that the high potential is supplied to the first-type logic gates and the low potential is supplied to the second-type logic gates, the power switch MOS is turned on. Further, in case of the adder, the specific status is equal to selecting a constant as an input of the adder. For general logic circuit, specific flip-flops are introduced to implement this specific status.

20 Claims, 23 Drawing Sheets

FIG. 4
(PRIOR ART)

| MODE | CNTL | POWER | PORT | | NODE | | | No. |
|---|---|---|---|---|---|---|---|---|
| | SWG | GNDH | IN | OUT | N0 | N1 | N2 | |
| NORMAL | H | L | L | L | H | L | H | 1 |
| | H | L | H | H | L | H | L | 2 |
| OFF | L | L | L | L | H | L | H | 3 |
| | L | L | H | H | L | H | L | 4 |
| | L | M | M | M | H | M | H | 5 |
| | L | M | H | H | M | H | M | 6 |
| | L | H | H | H | H | H | H | 7 |
| ON | H | H | H | H | H | H | H | 8 |
| | H | M | M | M | M | M | M | 9 |

| MODE | CNTL | | | POWER | | PORT | | NODE | | | No. |
|---|---|---|---|---|---|---|---|---|---|---|---|
| | SWV | SWG | DC | VCCL | GNDH | IN | OUT | N0 | N1 | N2 | |
| NORMAL | L | H | H | H | L | L | L | H | L | H | 1 |
| | L | H | H | H | L | H | H | L | H | L | 2 |
| DEFAULT | L | H | L | H | L | – | L | H | L | H | 3 |
| OFF | H | L | L | H | L | – | L | H | L | H | 4 |
| | H | L | L | M | M | – | L | H | L | H | 5 |
| | H | L | L | L | H | – | L | H | L | H | 6 |
| ON | L | H | L | L | H | – | L | H | L | H | 7 |
| | L | H | L | M | M | – | L | H | L | H | 8 |

| MODE | CNTL | | | POWER | | PORT | | NODE | | | No. |
|---|---|---|---|---|---|---|---|---|---|---|---|
| | SWV | SWG | DC | VCCL | GNDH | IN | OUT | N0 | N1 | N2 | |
| NORMAL | L | H | H | H | L | H | H | L | H | L | 1 |
| OFF | H | L | H | H | L | H | H | L | H | L | 2 |
| | H | L | H | M | M | H | M | M | M | M | 3 |
| | H | L | H | L | H | H | L | H | L | H | 4 |
| ON | L | H | H | L | H | H | L | H | L | H | 5 |
| | L | H | H | H | L | H | H | L | H | L | 6 |
| | L | H | H | M | M | H | M | M | M | M | 7 |

| MODE | CNTL | | | | POWER | | PORT | | NODE | | | No. |
|---|---|---|---|---|---|---|---|---|---|---|---|---|
| | SWV | SWG | EQC | DC | VCCL | GNDH | IN | OUT | N0 | N1 | N2 | |
| NORMAL | L | H | L | H | H | L | L | L | H | L | H | 1 |
| | L | H | L | H | H | L | H | H | L | H | L | 2 |
| DEFAULT | L | H | L | L | H | L | — | L | H | L | H | 3 |
| OFF | H | L | L | L | H | L | — | L | H | L | H | 4 |
| | H | L | L | L | M | M | — | L | H | L | H | 5 |
| | H | L | L | L | L | H | — | L | H | L | H | 6 |
| ON | H | L | H | L | L | H | — | L | H | L | H | 7 |
| | H | L | H | L | M | M | — | L | H | L | H | 8 |
| | H | L | H | L | H | L | — | L | H | L | H | 9 |
| | L | H | L | L | M | M | — | L | H | L | H | 10 |

F I G. 1 1

| MODE | CNTL | | | POWER | | PORT | | NODE | | | No. |
|---|---|---|---|---|---|---|---|---|---|---|---|
| | SGL | SGH | DC | GNDL | GNDH | IN | OUT | NO | N1 | N2 | |
| NORMAL | H | H | H | L | L | L | L | H | L | H | 1 |
| | H | H | H | L | L | H | H | L | H | L | 2 |
| DEFAULT | H | H | L | L | L | – | L | H | L | H | 3 |
| OFF | L | L | L | L | L | – | L | H | L | H | 4 |
| | L | L | L | M | M | – | M | M | M | M | 5 |
| | L | L | L | H | H | – | H | H | H | H | 6 |
| ON1 | H | L | L | H | H | – | H | H | H | H | 7 |
| | H | L | L | M | H | – | M | H | M | H | 8 |
| | H | L | L | L | H | – | L | H | L | H | 9 |
| ON2 | H | H | L | L | H | – | L | H | L | H | 10 |
| | H | H | L | L | M | – | L | H | L | H | 11 |

F I G. 1 2

| MODE | CNTL | | | POWER | | PORT | | NODE | | | No. |
|---|---|---|---|---|---|---|---|---|---|---|---|
| | SGL | SGH | DC | GNDL | GNDH | IN | OUT | N0 | N1 | N2 | |
| NORMAL | L | H | H | H | L | H | H | L | H | L | 1 |
| OFF | L | L | H | L | L | H | H | L | H | L | 2 |
| | L | L | H | M | M | H | H | M | H | M | 3 |
| | L | L | H | H | H | H | H | H | H | H | 4 |
| ON1 | H | L | H | H | H | H | H | H | H | H | 5 |
| | H | L | H | M | H | H | M | H | M | H | 6 |
| | H | L | H | L | H | H | L | H | L | H | 7 |
| | H | L | H | L | L | H | H | L | H | L | 8 |
| | H | L | H | M | M | H | H | M | H | M | 9 |
| | H | L | H | M | M | H | M | M | M | M | 10 |
| ON2 | H | H | H | L | H | H | L | H | L | H | 11 |
| | H | H | H | L | L | H | H | L | H | L | 12 |
| | H | H | H | M | M | H | M | M | M | M | 13 |

FIG. 15

| TYP | IN | | | | | | | OUT | | | | NODE | | | | | | No. |
|---|---|---|---|---|---|---|---|---|---|---|---|---|---|---|---|---|---|---|
| | AC | BC | A1 | B1 | A0 | B0 | C | S1 | S0 | AD | BD | AZ1 | BZ1 | AZ0 | BZ0 | CON | P1 | |
| A+B | H | H | L | L | L | L | L | L | L | H | H | L | L | L | L | H | L | 1 |
| A+B | H | H | L | L | L | H | L | L | H | H | H | L | L | L | H | H | H | 2 |
| A+B | H | H | L | L | H | L | L | H | L | H | H | L | L | H | L | H | H | 3 |
| A+B | H | H | L | H | L | L | L | H | H | H | H | L | H | L | H | H | L | 4 |
| A+B | H | H | L | H | L | H | L | H | H | H | H | L | H | L | H | H | L | 5 |
| A+B | H | H | L | H | H | L | L | H | H | H | H | L | H | H | L | H | H | 6 |
| A+B | H | H | H | L | L | L | L | H | H | H | H | H | L | L | H | H | H | 7 |
| A+B | H | H | H | L | L | H | H | L | L | H | H | H | L | L | H | H | H | 8 |
| A+B | H | H | H | L | H | L | L | H | H | H | H | H | L | H | L | H | L | 9 |
| A+B | H | H | H | L | H | H | H | L | H | H | H | H | L | H | H | H | H | 10 |
| A+B | H | H | H | H | L | L | L | H | H | H | H | H | H | L | L | H | L | 11 |
| A+B | H | H | H | H | L | H | H | L | H | H | H | H | H | L | H | H | H | 12 |
| A+B | H | H | H | H | H | L | H | H | L | H | H | H | H | H | L | H | L | 13 |
| A+B | H | H | H | H | H | H | H | H | H | H | H | H | H | H | H | H | H | 14 |
| A | L | H | L | L | – | – | L | L | L | L | H | L | L | L | L | L | L | 15 |
| A | L | H | L | H | – | – | L | H | L | L | H | L | H | L | L | L | L | 16 |
| A | L | H | H | L | – | – | L | L | H | L | H | H | L | L | L | L | H | 17 |
| A | L | H | H | H | – | – | L | H | H | L | H | H | H | L | L | L | H | 18 |
| B | H | L | – | – | L | L | L | L | L | H | L | L | L | L | L | H | L | 19 |
| B | H | L | – | – | L | H | L | L | H | H | L | L | L | L | H | H | H | 20 |
| B | H | L | – | – | H | L | L | H | L | H | L | L | L | H | L | H | H | 21 |
| B | H | L | – | – | H | H | L | H | H | H | L | L | L | H | H | H | L | 22 |
| ZERO | L | L | – | – | – | – | L | L | L | L | L | L | L | L | L | H | L | 23 |

| MODE | CNTL | POWER | OUT | | | NODE | | | | | | | | No. |
|---|---|---|---|---|---|---|---|---|---|---|---|---|---|---|
| | SWG | GNDH | C | S1 | SO | AD | BD | AZ1 | BZ1 | AZ0 | BZ0 | CON | P1 | |
| NORMAL | H | L | * | * | * | * | * | * | * | * | * | * | * | 1 |
| OFF | L | L | * | * | * | * | * | * | * | * | * | * | * | 2 |
| | L | M | * | * | * | * | * | * | * | * | * | * | * | 3 |
| | L | H | H | H | H | H | H | H | H | H | H | H | H | 4 |
| ON | H | H | H | H | H | H | H | H | H | H | H | H | H | 5 |
| | H | M | M | M | M | M | M | M | M | M | M | M | M | 6 |
| | H | L | * | * | * | * | * | * | * | * | * | * | * | 7 |

FIG. 20

| MODE | CNTL | | | POWER | | OUT | | | | | | | | NODE | | | | | | No. |
|---|---|---|---|---|---|---|---|---|---|---|---|---|---|---|---|---|---|---|---|---|
| | SWV | SWG | DC | VCCL | GNDH | C | S1 | S0 | AD | BD | AZ1 | BZ1 | AZ0 | BZ0 | CON | P1 | | | | |
| NORMAL | L | H | H | H | L | * | * | * | * | * | * | * | * | * | * | * | 1 |
| DEFAULT | L | H | L | H | L | L | L | L | L | L | L | L | L | L | H | L | 2 |
| OFF | H | L | L | H | L | L | L | L | L | L | L | L | L | L | H | L | 3 |
| OFF | H | L | L | M | M | L | L | L | L | L | L | L | L | L | H | L | 4 |
| OFF | H | L | L | L | H | L | L | L | L | L | L | L | L | L | H | L | 5 |
| ON | L | H | L | L | H | L | L | L | L | L | L | L | L | L | H | L | 6 |
| ON | L | H | L | M | M | L | L | L | L | L | L | L | L | L | H | L | 7 |
| ON | L | H | L | H | L | L | L | L | L | L | L | L | L | L | H | L | 8 |

FIG. 22

| MODE | CNTL | | | POWER | | OUT | | | | | NODE | | | | | | No. |
|---|---|---|---|---|---|---|---|---|---|---|---|---|---|---|---|---|---|
| | SLG | SGH | DC | GNDL | GNDH | C | S1 | S0 | AD | BD | AZ1 | BZ1 | AZ0 | BZ0 | CON | P1 | |
| NORMAL | H | H | H | L | L | * | * | * | * | * | * | * | * | * | * | * | 1 |
| DEFAULT | H | H | L | L | L | L | L | L | L | L | L | L | L | L | H | L | 2 |
| OFF | L | L | L | L | L | L | L | L | L | L | L | L | L | L | H | L | 3 |
| | L | L | L | M | M | M | M | M | M | M | M | M | M | M | H | M | 4 |
| | L | L | L | H | H | H | H | H | H | H | H | H | H | H | H | H | 5 |
| ON1 | H | L | L | H | H | H | H | H | H | H | H | H | H | H | H | H | 6 |
| | H | L | L | M | H | M | M | M | M | M | M | M | M | M | H | M | 7 |
| | H | H | L | L | H | L | L | L | L | L | L | L | L | L | H | L | 8 |
| ON2 | H | H | L | L | M | L | L | L | L | L | L | L | L | L | H | L | 9 |
| | H | H | L | L | L | L | L | L | L | L | L | L | L | L | H | L | 10 |
| | H | H | L | L | L | L | L | L | L | L | L | L | L | L | H | L | 11 |

F I G. 3 1
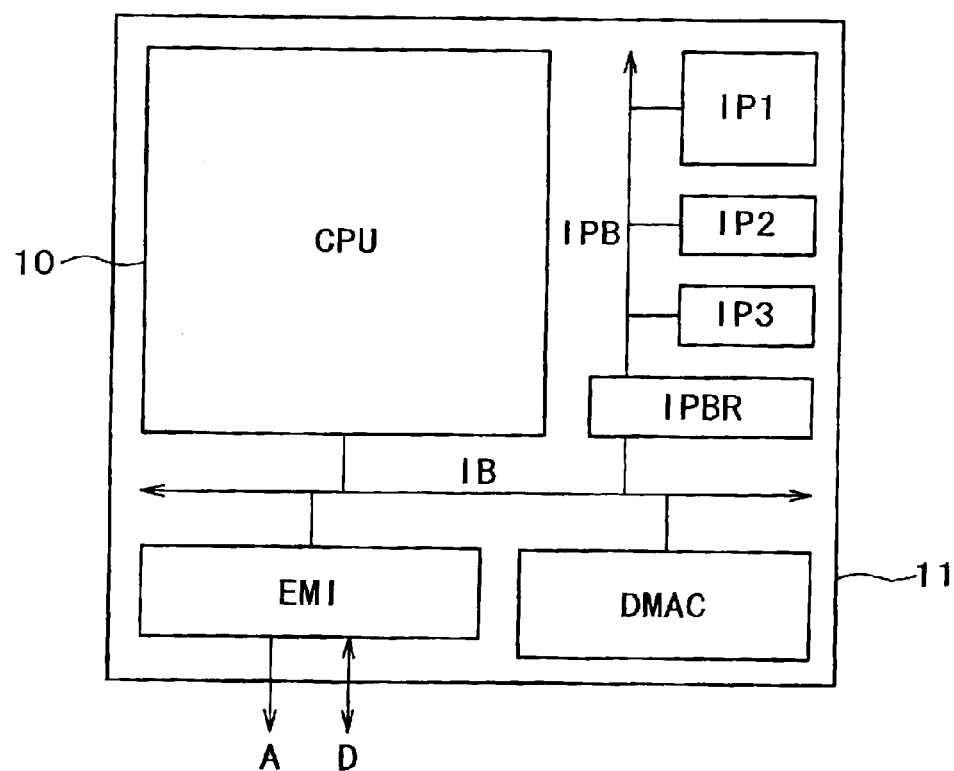

LOGIC CIRCUIT WHOSE POWER SWITCH IS QUICKLY TURNED ON AND OFF

BACKGROUND OF THE INVENTION

1. Field of the Invention

The present invention relates to a logic circuit suitable for use in a semiconductor integrated circuit, and particularly to a logic circuit composed of CMOS (Complementary Metal Oxide Semiconductor) circuitry, which consumes less power when the power is turned on or the circuit is not in use, and enables the power switch to be quickly turned on and off.

2. Description of the Related Art

With the growing demand for fine-fabrication and low power consumption, the power supply voltage for semiconductor integrated circuits has been decreasing year by year. In particular, the spread of portable battery-powered equipment such as mobile phones has been accelerating the demand for low power consumption. In semiconductor integrated circuits, particularly CMOS circuits, power is mostly consumed as switching power. The switching power is in proportion to the square of the power supply voltage and decreasing the power supply voltage is therefore the most effective means for reducing power consumption.

However, if the power supply voltage is decreased, the transistor drive capability will considerably decline and the operating speed will go down as the power supply voltage becomes close to the transistor's threshold voltage. To avoid this, it is necessary to lower the threshold voltage. As the threshold voltage is lowered, leakage current, which should be incommensurably smaller than the switching power, would increase exponentially and come to consume non-negligible power. It is expected that as the tendency towards further fine fabrication and lower power supply voltages continues, more power will be consumed for current leakage than for switching. Whereas the switching power is consumed only during operation of the circuit, power consumption due to leakage current continues while the power is on. When the circuit is not used for a long period, leakage current would become a dominant power consumer. Therefore it has been a common practice to turn off the whole circuitry or unnecessary circuits in order to reduce power consumption.

Another problem is that when the circuit is switched on after it has not been used for a long time, the voltage levels of output nodes of transistors may be inverted almost at the same time and at that time there occurs a flow of short-circuit current. This short-circuit current becomes one of the major reasons for increase in power consumption.

For example, JP-A No.29834/1994 (Literature 1) discloses a logic circuit in which a power switch (hereinafter called a "power switch MOS") composed of a high-threshold MOS transistor, which. is disposed between a logic circuit composed of low-threshold MOS transistors and a power line pair, is turned off while the circuit is inactive to prevent leakage current to the power line pair. The power switch MOSs may be disposed between the logic circuit and both the power lines. Further, in case of that the logic circuit includes a plurality of circuit stages, the power switch MOS may be disposed alternately between each circuit stage and one of the power line pair, according to the state of each circuit stage in the standby state.

JP-A No. 291929/1993 (Literature 2) discloses a logic circuit that adopts the circuit configuration as previously described regarding Literature 1 and adds a level hold circuit to an output node of the logic circuit in order to hold a level of the output node when the power switch MOS is turned off. The level hold circuit, which is composed of a high-threshold MOS transistor, is directly connected to the power line pair. Here, in an inverter chain where plural inverters are connected in cascade, the power supply is divided into odd-numbered inverters and even-numbered inverters. That is, the power supply voltage is supplied through different high-threshold power switch MOSs respectively to odd-number inverters and even-numbers inverters. Furthermore, two level hold circuits composed of high-threshold transistors are added respectively to the output node of the last odd-number inverter and the output node of the last even-number inverter. The level hold circuits are directly connected to the power line pair; in the inverter chain, when the power switch MOSs are turned off while the inverter chain is inactive, the level hold circuits hold the output levels. In the logic circuit as described in Literature 1, all nodes of the logic circuit reach the same level as the output node when the power switch MOS remains off for a long time. On the other hand, in the inverter chain as described in Literature 2, the nodes alternately reach the same level as the output node of the last odd-number inverter or the output node of the last even-number inverter and each inverter may hold the output level before a switching-off operation. Only when that is the case, no short-circuit current flows when the switch is turned on, even after a long switch-off period.

JP-A No.86916/1995 (Literature 3) discloses a circuit which has not only a power switch MOS but also a NAND gate before the logic circuit input node. The NAND gate is used to fix the preceding circuit's output node to a level in which short-circuit current does not flow upon a switching-on operation after a long switch-off period. In this circuit configuration, it is possible to prevent short-circuit current from flowing upon a switching-on operation not in a particular case but in any case.

Literature 3 reveals a technique which reduces both leakage current and short-circuit current when the power supply voltage is low. However, this technique is intended to be applied to a simple single-input logic circuit. In a logic circuit for multiple inputs, the node levels change from high to low or vice versa depending on input and thus it is impossible to uniquely decide to which line of the power line pair to connect the power switch MOS. If that is the case, the power supply voltage must be gradually changed in order to prevent an increase in short-circuit current. Therefore, it would be impossible to turn on and off the power as frequently as necessary or quickly.

The primary object of the present invention is to provide a logic circuit which assures short-circuit current reduction by using a gate which uniquely fixes the level of each node and also reduces leakage current so that the power is turned on and off quickly.

SUMMARY OF THE INVENTION

In order to achieve the above object, a "specific status" is defined for a subject logic circuit. The subject logic circuit is controlled to the specific status at least while the power switch MOS transfers from turning off to turning on. Generally speaking, a logic circuit, either single-input or multi-input, cannot predict a status when the logic circuit transfers the operating mode, that is the power switch MOS turns on, or to the standby mode, that is the power switch MOS turn off. Defining the specific status avoids this unpredictability.

The subject logic circuit is configured so that a short-circuit current is suppressed to flow through the logic circuit under the specific status. So, logic gates of the subject logic circuit are divided into first-type logic gates and second-type logic gates. The first-type logic gate includes an internal node having high potential, for example, and a MOS transistor driving that internal node under the specific status. The second-type logic gate includes an internal node having low potential, for example, and a MOS transistor driving that internal node under the specific status. The inventor finds no problem occurs in terms of short-circuit current when the low potential node is in a floating state in the first-type logic gate as long as the high potential node supplies high potential. Similarly, no problem occurs in terms of short-circuit current when the high potential node is in a floating state in the second-type logic gate as long as the low potential node supplies low potential. In short, under the state that the high potential is supplied to the first-type logic gates and the low potential is supplied to the second-type logic gates, the power switch MOS is turned on.

The two schemes to implement the above-described potential supply are described below. The first one is implemented by the circuit configuration shown in FIG. 5. The second one is implemented by the time series control shown in FIG. 10. When the power switch MOS 6b turns on, the above-described specific state is accomplished.

Further, the present invention includes the implementation of the above-described mechanism to a multi-input circuit such as an adder and general logic circuit. In case of the adder, the specific status is equal to selecting a constant as an input of the adder. For the general logic circuit, specific flip-flops are introduced to implement the mechanism.

Other and further objects, features and advantages of the invention will appear more fully from the following description.

BRIEF DESCRIPTION OF THE DRAWINGS

FIG. 4 is a table listing possible statuses in the ordinary inverter chain circuit shown in FIG. 3;

FIG. 11 is a table listing possible statuses in the third inverter chain circuit shown in FIG. 10;

FIG. 12 is a table explaining a faulty operation in the third inverter chain circuit shown in FIG. 10;

FIG. 15 is a table listing operating statuses in the logic circuit shown in FIG. 14;

FIG. 20 is a table listing power supply statuses in the logic circuits shown in FIG. 18 and FIG. 19;

FIG. 22 is a table listing power supply statuses in the logic circuit shown in FIG. 21;

FIG. 31 shows the structure of a processor according to a third embodiment of the present invention.

DETAILED DESCRIPTION OF THE PREFERRED EMBODIMENTS

Figure 1:
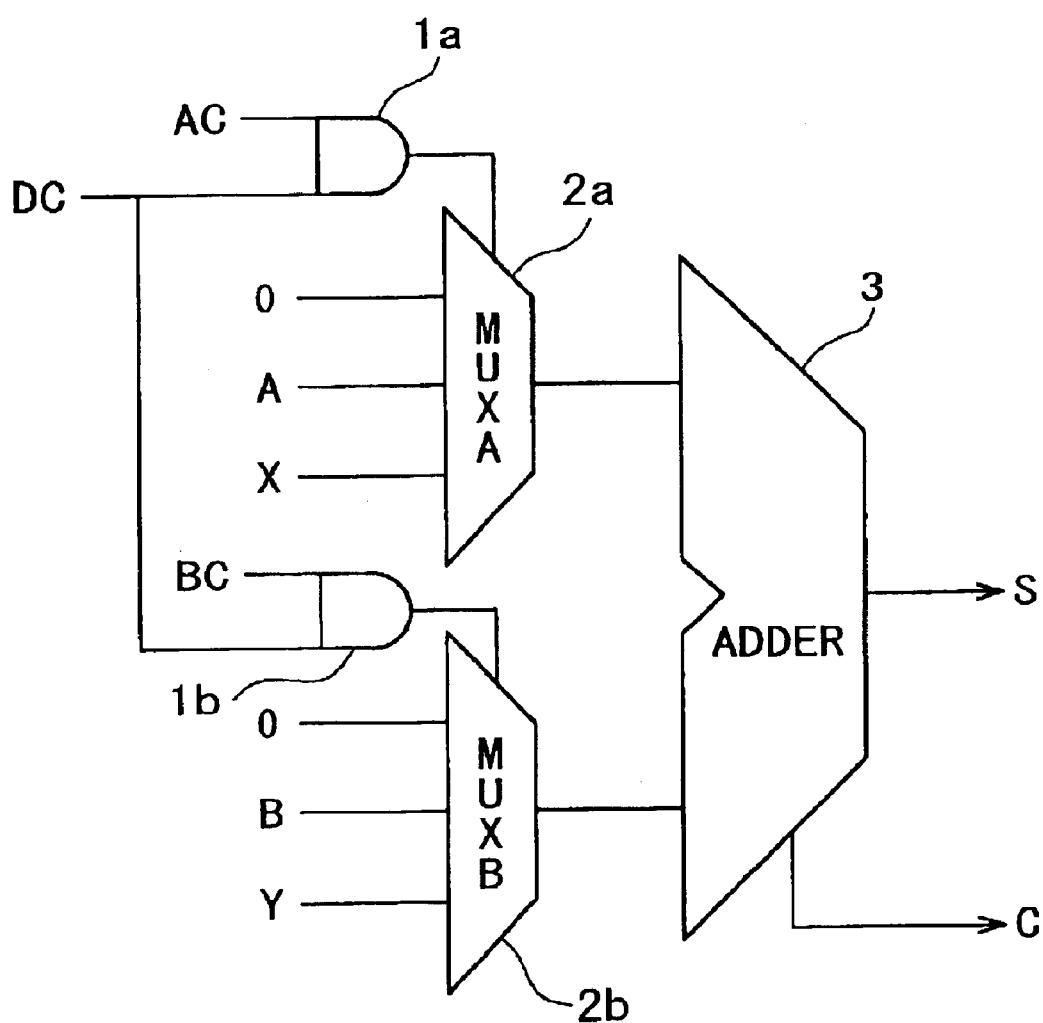
FIG. 1 shows the structure of a logic circuit according to a first embodiment of the present invention.

Next, preferred embodiments of the present invention will be described in detail referring to the accompanying drawings illustrating relevant logic circuits. The same reference numerals given in FIGS. 1 to 31 designate the same or similar elements.

<Embodiment 1>

The basic structure of an adder according to the present invention is shown in FIG. 1. In the figure, 1a and 1b represent control gates on the A and B sides for input of a control signal for specific status DC, respectively; 2a a multiplexer (MUX) as a selector which selects input signals 0, A, X on the A side according to input select signal AC; 2b a multiplexer as a selector which selects input signals 0, B, Y on the B side according to input select signal BC; and 3 an adder which receives the results of multiplexers 2a and 2b and outputs sum S and carry C. This basic structure is a variation of the conventional structure, where the control gates for specific status 1a and 1b are respectively added before the gates for input of input select signals AC and BC in the conventional adder shown in FIG. 2. When the control signal DC is inputted, the control gates 1a and 1b control the multiplexers 2a and 2b (selectors) to let them output specific values, thereby bringing the adder 3 into the specific status, which will be explained later.

Figure 2:
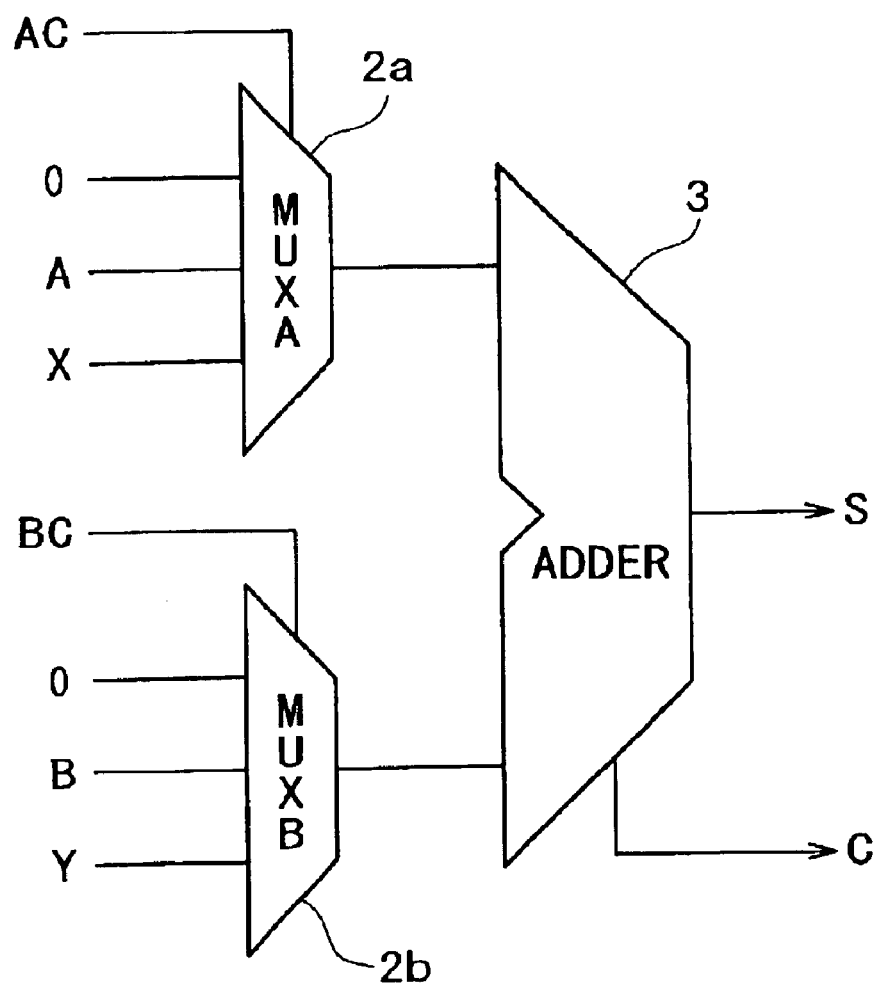
FIG. 2 shows the structure of a conventional logic circuit.

As a preliminary step for the explanation of the adder based on the present invention, we will briefly outline the effect produced by the use of control gates 1a and 1b in a simpler inverter chain and then describe the conventional adder shown in FIG. 2.

Figure 3:
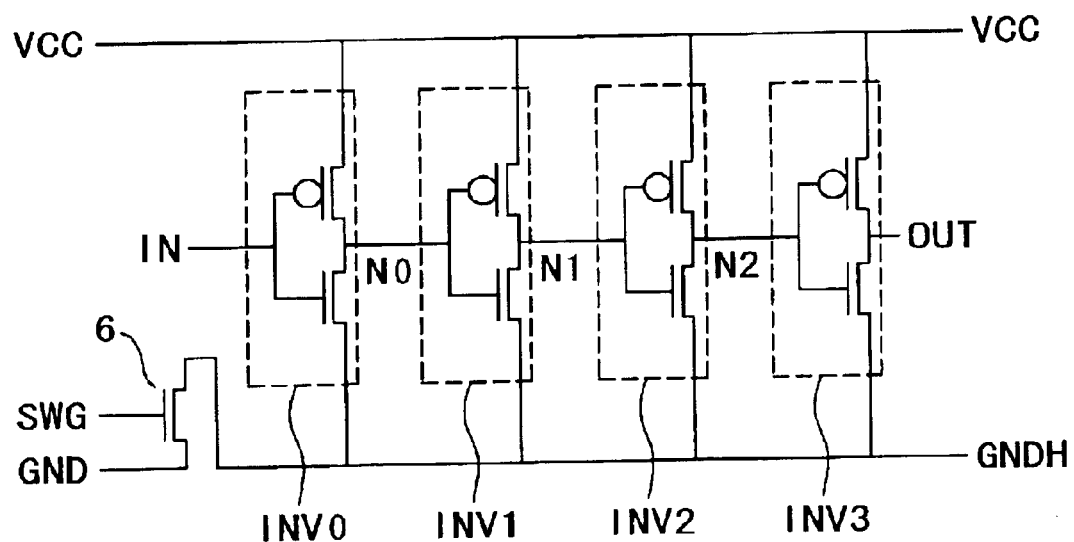
FIG. 3 is a circuit diagram illustrating an ordinary inverter chain circuit.

Prior to the general description of the above effect, we will describe an ordinary inverter chain circuit without a control signal gate for specific status. FIG. 3 shows such an ordinary inverter chain circuit. Between input node IN and output node OUT are four inverters INV0, INV1, INV2, INV3 which are connected through internal nodes N0, N1, and N2; the high potential side of each inverter is directly connected with the power supply line VCC and its low potential side is connected with the local ground supply line GNDH. The local ground supply line GNDH is connected through a high-threshold NMOS transistor 6 to the ground supply line GND.

FIG. 4 lists various statuses in the above inverter chain circuit. L denotes low potential, M middle potential, and H high potential. In the rightmost column of the table of FIG. 4, a status reference number is given for each status. Listed in the control status MODE column are three modes: NORMAL (operating status), OFF (switch-off status) and ON (switch-on status).

In the operating status NORMAL mode, there are two statuses (No.1, No.2), which correspond to respectively low potential L and high potential H of input node IN. In these statuses, a first switch control signal SWG remains high potential H so that the local ground supply line GNDH is electrically connected with the ground supply line GND. Thus the potential of the local ground supply line stays at low potential L. Depending on the potential of input node IN, nodes N0, N1, N2 and node OUT are fixed at either low potential L or high potential H as shown in the table.

In the switch-off status OFF mode, the first switch control signal SWG is at low potential L so that the local ground supply line GNDH is disconnected from the ground supply line GND. A status transition takes place depending on the status before the disconnection. If the previous status is status No.1, a transition to status No.3 to No.5 to No.7 occurs. If the previous status is status No.2, a transition to status No.4 to No.6 to No.7 occurs. Status No.3 and 4 come just after the disconnection so they have the same condition as before the disconnection. As a consequence of the disconnection, leakage current stops flowing on the low potential side. On the other hand, on the high potential side where no disconnection has been made, leakage current continues to flow so that the nodes with low potential L and the local ground supply line GNDH gradually become higher potential; there occurs a transition to status No.5 or No.6 (middle potential M) to status No.7 (high potential H). On the other hand, since the disconnection stops the flow of leakage current, the nodes with high potential remain high potential H. As a result, when an adequate time has passed after the disconnection, all the nodes are at high potential H as in status No.7.

In the switch-on status ON mode, the first switch control signal SWG is again at high potential H so that the local ground supply line GNDH is electrically connected with the ground supply line GND, so the potential of the local ground line is at low potential L. That is, there occurs a transition from status No.7 to status No.8. At this moment, all the nodes are at high potential H, so all NMOS transistors become electrically conductive and the potentials of all nodes decrease. As the potential decreases, the PMOS transistors also become electrically conductive, so that short-circuit current flows and the potentials of all nodes reach the middle potential M shown as status No.9. Then, starting with input node IN, the potentials of the nodes are fixed sequentially and there occurs a transition to status No.1 or No.2 in the operating status NORMAL mode. Even when the switch-off status has lasted for a comparatively short time and a transition is made from status No.5 or No.6 to the switch-on status ON mode, all the nodes are at high potential H or middle potential M, so the potentials of the nodes with high potential H decreases and a transition is made through status No.9 to status No.1 or status No.2. The short-circuit current is flowing during this transition.

In the ordinary circuit shown in FIG. 3, the potential of the local ground supply line GNDH may be gradually changed in order to limit the short-circuit current within the permissible range. In other words, if the potential of the local ground supply line GNDH should be quickly changed, the short-circuit current might go beyond the permissible range. Hence, it is impossible to switch on an ordinary circuit quickly.

Figures 5, 6:
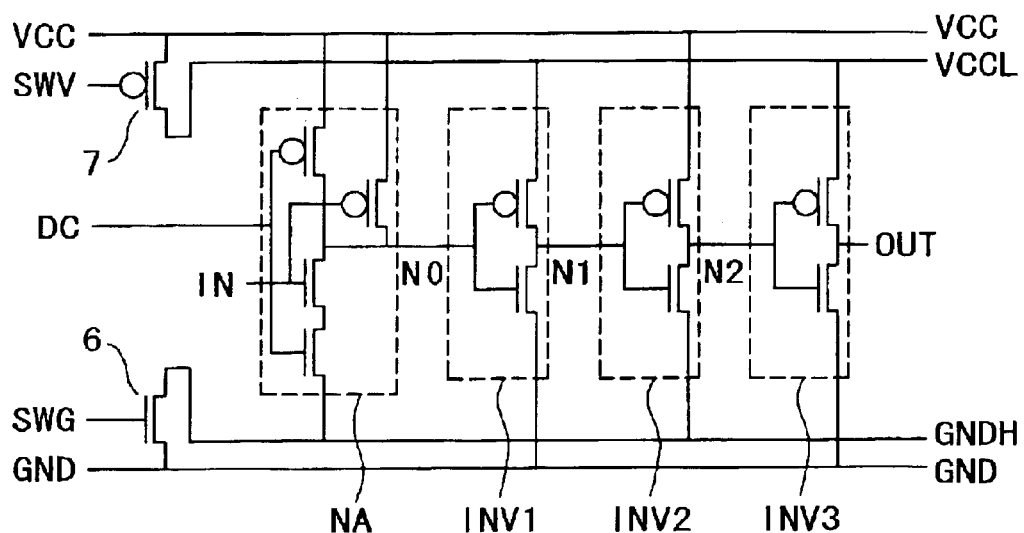
FIG. 5 is a circuit diagram illustrating a first inverter chain with a control gate for specific status.
FIG. 6 is a table listing possible statuses in the first inverter chain circuit shown in FIG. 5.

FIG. 5 shows a first inverter chain circuit with a control gate for specific status. In this first circuit, the inverter INV0 for receiving an input signal IN as shown in FIG. 3 is replaced by a NAND gate NA to output the inverted logical product of the control signal DC and input signal IN. Here, the inverter INV0 is thus transformed into a NAND gate with the function of control gate for specific status 1.

In addition, a local power supply line VCCL is added on the high potential side. The local power supply line VCCL is connected to the power supply line VCC through a high-threshold PMOS transistor 7 that is controlled by a second switch control signal SWV. Here, with the control signal DC at low potential L, the potential of the output node N0 of the NAND gate NA becomes high. Then, the nodes N1, N2 and OUT sequentially become low, high, and low in potential respectively. Here, let's define the nodes N1 and OUT and MOS transistors for driving them as a low potential group and the nodes N0 and N2 and MOS transistors for driving them as a high potential group. The high potential power terminals in the low potential group are connected to the local power supply line VCCL and the low potential power terminals in the low voltage group to the ground supply line GND. The high potential power terminals in the high potential group are connected to the power supply line VCC and the low potential power terminals in the high potential group are connected to the local ground supply line GNDH.

FIG. 6 shows possible statuses in the first inverter chain circuit. As a control status mode, a specific status DEFAULT mode is added to the three modes in the table of FIG. 3.

In the operating status NORMAL mode, there are two statuses (No.1, No.2), which correspond to low potential L and high potential H of input node IN. In these statuses, the first switch control signal SWG and the second switch control signal SWV are respectively at high potential H and low potential L; the local ground supply line GNDH and the local power supply line VCCL are electrically connected with the ground supply line GND and the power supply line VCC respectively and thus become low potential L and high potential H respectively. The control signal for specific status DC becomes high potential H and the potential of node N0 changes depending on the potential of input node IN. Then, the nodes N0, N1, N2 and OUT are fixed at low potential L or high potential H as shown in FIG. 6.

In the specific status DEFAULT mode, the control signal for specific status DC is at low potential L. As a result, the nodes N0, N1, N2, and OUT are uniquely fixed at low potential L or high potential H regardless of the voltage of input node IN, as mentioned above.

The switch-off status OFF mode should come after the specific status DEFAULT mode. In this OFF mode, the first switch control signal SWG and second switch control signal SWV become low potential L and high potential H, respectively; the local ground supply line GNDH and the local power supply line VCCL are disconnected from the ground supply line GND and the power supply line VCC, respectively. Just after the disconnection, the node voltages in the specific status DEFAULT mode are maintained and thus there comes status No.4. Then, status No.4 is followed by status No.5 where the local ground supply line GNDH and local power supply line VCCL are at middle potential M; then, a transition to status No.6 occurs in an adequate time.

Meanwhile, regarding nodes N0 and N2, since the local ground supply line GNDH is disconnected from the ground supply line GND, leakage current on the low potential side increases the potential of the local ground supply line GNDH, which decreases the voltage difference between the power supply line VCC and the local ground line GNDH and reduces leakage current. When the potential of the local ground supply line GNDH changes to middle potential M, then after an adequate time, to high potential H, leakage current stops. The high potential H of nodes N0 and N2 is maintained as the power supply line VCC compensates for leakage current. Likewise, regarding nodes N1 and OUT, since the local power supply line VCCL is disconnected from the power supply line VCC, leakage current on the high potential side decreases the potential of the local power supply line VCCL, which decreases the potential difference between the local power supply line VCCL and the ground supply line GND and reduces leakage current. When the potential of the local power supply line VCCL changes to middle potential M, then after an adequate time, to low potential L, leakage current stops. The low potential L of nodes N1 and OUT is maintained as the ground supply line GND compensates for leakage current.

In the switch-on status ON mode, the first switch control signal SWG and the second switch control signal SWV respectively become high potential H and low potential L; the local ground supply line GNDH and local power supply line VCCL are electrically connected with the ground supply line GND and power supply line VCC respectively and become low potential L and high potential H respectively. The control signal for specific status DC remains low potential L. As a consequence, when the switch-off status No.6 has lasted for a long time, there occurs a transition through status No.7 and 8 to status No.3 in the specific status DEFAULT mode. Meanwhile, nodes DC and N1 are at low potential L so that NMOS transistors of the NAND gate NA and the inverter INV2 disconnect node N0 and N2 from the local ground supply line GNDH respectively. So, nodes N0 and N2 remain high potential H. Likewise, nodes N0 and N2 are at high potential H so that PMOS transistors of the inverter INVL and the inverter INV3 disconnect node N1 and OUT from the local power supply line VCCL respectively. So, nodes N1 and OUT remain low potential L.

If the switch-off status OFF mode has lasted for a comparatively short time and a transition from status No.5 to the switch-on status ON mode has taken place, there occurs a transition through status No.8 to status No.3.

If the switch-off status OFF mode has lasted only for a very short time and a transition from status No.4 to the switch-on status ON mode has taken place, immediately status No.3 follows.

In the specific status DEFAULT mode which comes after the above transitions, status No.1 or No.2 in the operating status NORMAL mode is restarted when the control signal for specific status DC is returned to high potential H.

Figures 7, 8:
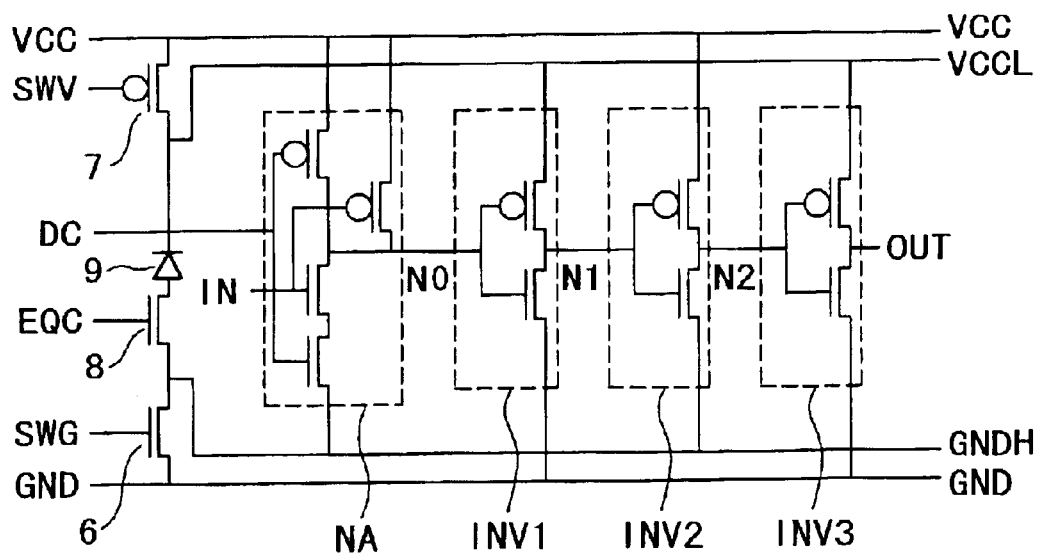
FIG. 7 is a table explaining a faulty operation in the first inverter chain circuit shown in FIG. 5.
FIG. 8 is a circuit diagram illustrating a second inverter chain with a control gate for specific status.

FIG. 7 concerns a faulty operation in the first inverter chain circuit shown in FIG. 5. A faulty operation occurs when a transition is made to the switch-off status OFF mode while the control signal for specific status DC remains high potential, even though the potentials of the nodes in the operating status NORMAL mode are different from those in the specific status DEFAULT mode. In FIG. 7, the potentials of the nodes in the operating status NORMAL mode are reverse to those in the specific status DEFAULT mode.

When in this condition the circuit enters on status No.2 in the switch-off status OFF mode, then a transition is made to status No.3, then after an adequate time, to status No.4. Meanwhile, nodes N0, N2, and the local ground supply line GNDH are connected through low-threshold PMOS transistors of the NAND gate NA and the inverter INV2 respectively to the power supply line VCC and disconnected from the ground supply line GND; thus due to leakage current on the high potential side, they change from low potential L through middle potential M, and after an adequate time, to high potential H. Likewise, nodes N1, OUT, and the local power supply line VCCL are connected through low-threshold NMOS transistors of the inverter INVL and the inverter INV3 respectively to the ground supply line GND and disconnected from the power supply line VCC; thus due to leakage current on the low potential side, they change from high potential H through middle potential M, and after an adequate time, to low potential L. As a result, the potentials of the local supply lines GNDH and VCCL and nodes N0, N1, N2 and OUT, that is status No.4, are reverse to those before the switch-off status OFF mode.

Then, there is a transition from status No.4, which has been reached upon elapse of an adequate time in the switch-off status OFF mode, to the switch-on status ON mode, in which a transition is then made from status No.5 to status No.6. Meanwhile, the inverted potentials of the local supply lines GNDH and VCCL and nodes N0, N1, N2 and OUT return to their original potentials. However, since potential change occurs sequentially in the order of the local supply lines GNDH and VCCL, nodes N0, N1, N2 and OUT, there is no flow of impermissible short-circuit current as in normal switching operation. Even when the switch-on status ON mode comes immediately after the switch-off status OFF mode, that is a transition from status No.2 to status No.6 takes place, there is change only in the first switch control signal SWG and second switch control signal SWV and there is no problem.

A problem occurs when there is a transition from status No.3 in the switch-off status OFF mode to the switch-on status ON mode. In this case, the transition is made from status No.3 to status No.7 and nodes N0, N1, N2 and OUT are at middle potential M. Therefore, if the first switch control signal SWG and second switch control signal SWV are set to high potential H and low potential L respectively so that the local ground supply line GNDH and local power supply line VCCL are connected with the ground supply line GND and the power supply line VCC respectively, short-circuit current flows all at once. As a result, there occurs a flow of impermissible short-circuit current.

As explained above, in the first inverter chain circuit with a control gate for specific status, the circuit is brought to the specific status DEFAULT mode by the control signal for specific status DC, which assures suppression of short-circuit current when the power supply line to be connected with the power terminal of each element is chosen in a manner appropriate to the specific status DEFAULT mode.

FIG. 8 shows a second inverter chain circuit with a control gate for specific status. The second circuit is almost the same as the first circuit except that the local ground supply line GNDH and local power supply line VCCL are connected through a high-threshold MOS transistor 8 that is controlled by a potential equalize control signal EQC and a reverse current prevention diode 9.

Figures 9, 10:
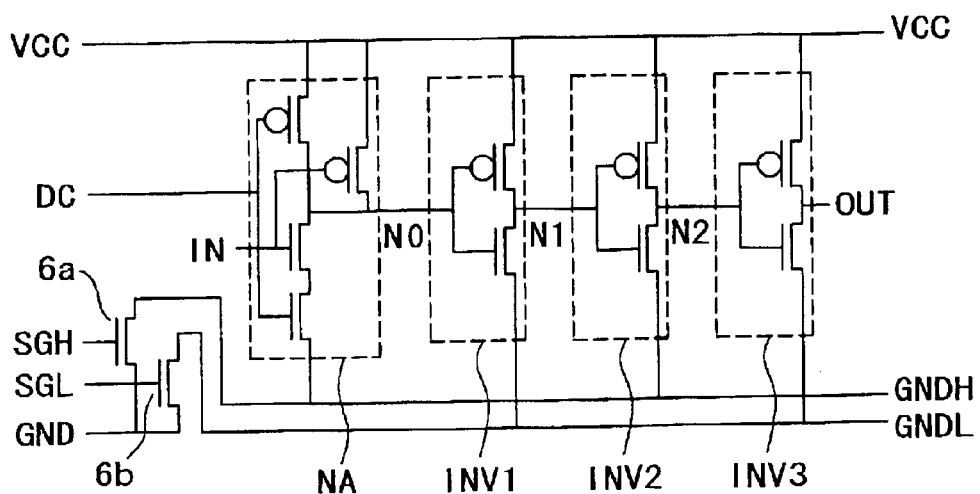
FIG. 9 is a table listing possible statuses in the second inverter chain circuit shown in FIG. 8.
FIG. 10 is a circuit diagram illustrating a third inverter chain with a control gate for specific status.

FIG. 9 lists possible statuses in the second inverter chain circuit. Here, the operating status NORMAL mode, specific status DEFAULT mode and switch-off status OFF mode are the same as mentioned above. In these modes, the potential equalize control signal EQC is held at low potential L.

In the switch-on status ON mode, first of all the potential equalize control signal EQC is brought to high potential H. If the switch-off status OFF mode has lasted so long to enter on the status No.6, current flows from the local ground supply line GNDH to the local power supply line VCCL through the MOS transistor 8 and the reverse current prevention diode 9 because the potentials of the local ground supply line GNDH and local power supply line VCCL are reverse to their original potentials. Consequently the potentials of both the lines are equalized and reach the level of middle potential M. If the RC time constant is controlled adequately, the current flow continues even after middle potential M is reached, so that the potentials become closer to the original levels. This transition corresponds to statuses No.7, 8 and 9. Then, in status No.9, the first switch control signal SWG and second switch control signal SWV are brought to high potential H and low potential L respectively so that the specific status DEFAULT mode is restored. As a result, the electric charge of the local ground supply line GNDH and local power supply line VCCL, which would be consumed in the above described first inverter chain circuit, is reused, thereby reducing power consumption.

When the duration of the switch-off status OFF mode is relatively short, that is the circuit is in status No.4 or No.5, since the potentials of the local ground supply line GNDH and the local power supply line VCCL are not reverse to their original potentials, there is no current flow due to the reverse current prevention diode 9, even when the potential equalize control signal EQC is at high potential H. As a result, it is possible to prevent a faulty operation that inverts non-inverted voltages.

FIG. 10 shows a third inverter chain circuit with a control gate for specific status. As in the above described first inverter chain circuit, in the third circuit, the inverter INV0 that receives input signal IN is replaced by a NAND gate NA to output the inverted logical product of the control signal for specific status DC and input signal IN. In addition, there are two low potential local power supply lines, GNDH and GNDL, which are connected to the ground supply line GND through high-threshold NMOS transistors 6a and 6b which are controlled by third and fourth switch control signals SGH and SGL respectively. Here, with the control signal for specific status DC at low potential L, the potential of the node N0 that is the output node of the NAND gate NA becomes high potential regardless of the potential of the input node IN. The nodes N1, N2 and OUT become low, high, and low in potential, respectively.

Here, let's define the nodes N1 and OUT and MOS transistors for driving them as a low potential group and the nodes N0 and N2 and MOS transistors for driving them as a high potential group. The low potential power terminals in the low and high potential groups are respectively connected to the local ground supply lines GNDL and GNDH. The high potential power terminals in both groups are connected to the power supply line VCC. This circuit uses high-threshold NMOS transistors 6a and 6b as power switch MOSs which connect the local ground supply lines GNDH and GNDL to the ground supply line GND and does not need the high-threshold PMOS transistor 7, which is needed in the above-described first and second inverter chain circuit. This circuit uses three supply lines while the above-described first and second examples use four.

Alternatively, it is possible to provide two local power supply lines on the power supply line VCC side, and put two high-threshold PMOS transistors between the two local power supply lines and the power supply line VCC respectively. In that case, the low potential power terminals in both groups are connected to the ground supply line GND.

FIG. 11 lists possible statuses in the third inverter chain circuit. Like the circuit shown in FIG. 6, L denotes low potential, M middle potential, and H high potential. In the rightmost column of the table, a status reference number is given for each status. In the MODE column, control status modes are listed as in FIG. 6, but the difference is that there are two switch-on status modes, ON1 and ON2.

The operating status NORMAL mode has two statuses (No.1, No.2), which correspond to low potential L and high potential H of the input node IN. In these statuses, the switch control signals SGH and SGL are at high potential H and the local ground supply lines GNDH and GNDL are electrically connected with the ground supply line GND and thus become low potential L. The control signal for specific status DC becomes high potential H and the node N0 changes depending on the potential of the input node IN. The nodes N0, N1, N2 and OUT are fixed at low potential L or high potential H as shown in FIG. 11.

In the specific status DEFAULT mode, the control signal for specific status DC is at low potential L. As a result, the nodes N0, N1, N2, and OUT are uniquely fixed at low potential L or high potential H regardless of the potential of input node IN, as shown as status No.3.

The switch-off status Off mode should come after the specific status DEFAULT mode. In the switch-off status OFF mode, the switch control signals SGH and SGL are at low potential L and the local ground supply lines GNDH and GNDL are disconnected from the ground supply line GND. Just after the disconnection, the node potentials in the specific status DEFAULT mode are maintained and thus there comes status No.4. Then, status No.4 is followed by status No.5 where the nodes N1 and OUT with low potential L, and the local ground supply lines GNDH, GNDL are at middle potential M; then, after an adequate time, there occurs a transition to status No.6 where all nodes are at high potential H.

Meanwhile, regarding the nodes N0 and N2, since the local ground supply line GNDH is disconnected from the ground supply line GND, leakage current on the low potential side increases the potential of the local ground supply line GNDH, which decreases the potential difference between the power supply line VCC and the local ground supply line GNDH and reduces leakage current. The potential of the local ground supply line GNDH changes to middle potential M, then after an adequate times to high potential H and leakage current stops. The high potential H of nodes N0 and N2 is maintained as the power supply line VCC compensates for leakage current. On the other hand, the potential of nodes N1 and OUT and the local ground supply line GNDL increases to middle potential M, then to high potential H due to leakage current from the power supply line VCC. This decreases the potential difference between the power supply line VCC and the local ground supply line GNDL and thus reduces leakage current. When high potential H is reached in an adequate time, leakage current stops.

In the switch-on status ON1 mode, the fourth switch control signal SGL becomes high potential H and the local ground supply line GNDL is electrically connected with the ground supply line GND and becomes low potential L. As a consequence, when the switch-off status No.6 has lasted for a long time, there occurs a transition through status No.7, status No.8 to status No.9. Meanwhile, the nodes N0, N2 and local ground supply line GNDH remain high potential H because they are disconnected from the ground supply line GND. On the other hand, the nodes N1 and OUT are disconnected from the power supply line VCC by PMOS transistors of the inverter INVL and the inverter INV3 respectively because the nodes N0 and N2 are at high potential H. So, the nodes N1 and OUT and the local ground supply line CNDL go through middle potential M down to low potential L.

If the switch-off status OFF mode has lasted for a short time and a transition from status No.5 to the switch-on status ON mode has taken place, there follows a transition from status No.8 to status No.9 in the switch-on status ON1 mode. Here, the nodes N0, N2 and the local ground supply line GNDH remain high potential H and the nodes N1 and OUT go through middle potential M down to low potential L along with the local ground supply line GNDH. If the switch-off OFF mode lasted only for a very short time and a transition from status No.4 to the switch-on ON mode has taken place, immediately status No.9 follows.

In the switch-on status ON2 mode, the third switch control signal SGH is again at high potential H and the local ground supply line GNDH is electrically connected with the ground supply line GND and goes through middle potential M down to low potential L. Here, since the local ground supply line GNDH is disconnected from the nodes N0 and N2 with high potential by the NMOS transistors included in the NAND gate NA and the inverter INV2, which are controlled by the nodes DC and N1 with low potential L in the switch-on status ON1 mode, so the nodes N0 and N2 remain high potential H. As a result, there occurs a transition through status No.10 and status No.11, again to status No.3 in the specific status DEFAULT mode. The control signal for specific status DC returns to high potential H in the specific status DEFAULT mode; then status No.1 or No.2 in the operating status NORMAL mode are restored.

FIG. 12 concerns a faulty operation in the third inverter chain circuit. As in the first circuit, a faulty operation occurs when a transition is made to the switch-off status OFF mode while the control signal for specific status DC remains high potential H, even though the potentials of the nodes in the operating status NORMAL mode are different from those in the specific status DEFAULT mode.

In FIG. 12, the potentials of the nodes in the operating status NORMAL mode are reverse to those in the specific status DEFAULT mode. In this condition, there occurs a transition to status No.2 in the switch-off status OFF mode, which is followed by status No.3, then after an adequate time, status No.4. Meanwhile, since the nodes N0, N2, and the local ground supply lines GNDH and GNDL are connected through low-threshold MOS transistors to the power supply line VCC and disconnected from the ground supply line GND, due to leakage current on the high potential side, their potentials change from low potential L through middle potential M, and after an adequate time, to high potential H. On the other hand, the nodes N1 and OUT remain high potential H because they are disconnected from the ground supply line GND. As a result, all nodes are at high potential H.

Then, there is a transition from status No.4, which has come upon elapse of an adequate time in the switch-off status OFF mode, to the switch-on status ON1 mode, in which a transition is then made through status No.5, status No.6 to status No.7. In this case, the circuit operates in the same way as in the switch-on status ON1 mode shown in FIG. 11 and there is no problem. However, the difference from the case shown in FIG. 11 is that the control signal for specific status DC and input node IN are at high potential H. There in no problem however. The reason is as follows; the NMOS transistors that are controlled by these signals are to connect the node N0 with the local ground supply line GNDH. In the switch-on status ON1 mode, the local ground supply line GNDH remains high potential H. This means that even when the NMOS transistors are electrically connected, the high potential H of node N0 is maintained.

Then, the circuit enters on the switch-on status ON2 mode where a transition from status No.11 to No.12 takes place. Meanwhile, the potentials of the local ground supply line GNDH and nodes N0, N1, N2 and OUT are sequentially inverted in the order of mention and therefore as in normal switching operation, there is no flow of impermissible short-circuit current. Even when the switch-on status ON1 mode comes immediately after the switch-off status OFF mode, or when a transition from status No.2 to status No.8 occurs, there is change only in the fourth switch control signal SGL and there is no problem. Even when a further transition to the switch-on status ON2 mode takes place, there is change only in the third switch control signal SGH and a transition to status No.12 takes place without any problem.

A problem occurs when there is a transition from status No.3 in the switch-off status OFF mode, in which an adequate time has not elapsed in the OFF mode and the nodes N0 and N2 have changed from low potential L to middle potential M, to the switch-on status ON1 mode. In this case, the transition is made from status No.3 through status No.9 to status No.10. Since the nodes N0 and N2 are at middle potential M, if the fourth switch control signal SGL is set to high potential H and the local ground supply line GNDL is connected with the ground supply line GND, the MOS transistors which are controlled by the nodes N0 and N2 are connected at the same time and short-circuit current begins to flow through the nodes N1 and OUT which are driven by these MOS transistors. The potentials of nodes N1 and OUT change from high potential H to middle potential M.

As the circuit enters on the switch-on status ON2 mode, there comes status No.13. Since the third switch control signal SGH is set to high potential H, the local ground supply line GNDH is electrically connected with the ground supply line GND so that the MOS transistors which are controlled by the node N1 with middle potential M become conductive at the same time. Then short-circuit current begins to flow through the node N2 which is driven by that MOS transistor. As a result, there is a flow of impermissible short-circuit current.

As explained above, in the third inverter chain circuit with a control gate for specific status, the circuit is brought to the specific status DEFAULT mode by the control signal for specific status DC, which ensures suppression of short-circuit current when the power supply line to be connected with the power terminal of each element is chosen in a manner appropriate to the specific status DEFAULT mode.

Then, the conventional adder shown in FIG. 2 is described next. According to the input select signal AC, the multiplexer 2a selects one of A side input signals, O, A, and X and supplies it to one input of the adder 3. Similarly, according to the input select signal BC, the multiplexer 2b selects one of B side input signals, O, B, and Y and supplies it to the other input of the adder 3. The adder 3 sums up these two inputs and outputs sum S and carry C. The adder 3 can output A+B, A+Y, B+X, X+Y, A, B, X, Y or 0 depending on the values of input select signals AC and BC.

Figure 13:
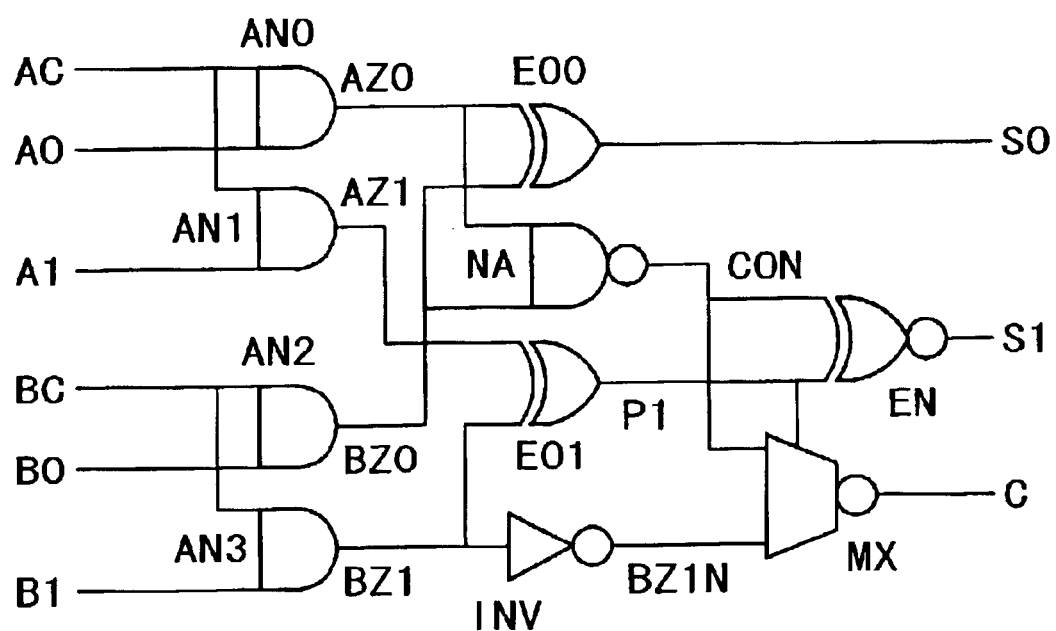
FIG. 13 is a logic diagram illustrating the logical configuration of the conventional logic circuit shown in FIG. 2.

The adder shown in FIG. 2 may be considered as a typical N-bit adder (where N is a natural number). Here, in order to describe the circuit operation more specifically, N is assumed to be 2, which means input signals X and Y are omitted in FIG. 2, as shown in FIG. 13. In other words, the circuit shown in FIG. 13 is a 2-bit adder with a function that makes input signal zero. Since there are no input signals X and Y, input selection can be implemented by AND gates AN0, AN1, AN2, and AN3 which are simpler than multiplexers.

If the input select signal AC is 1, AZ0 as the output of the AND gate AN0 and AZ1 as the output of the AND gate AN1 are equivalent to A side input signals A0 and A1 respectively. And, if the input select signal AC is 0, both AZ0 and AZ1 are equivalent to 0. Likewise, if the input select signal BC is 1, BZ0 as the output of the AND gate AN2 and BZ1 as the output of the AND gate AN3 are equivalent to B side input signals B0 and B1 respectively. And, if the input select signal BC is 0, both BZ0 and BZ1 are equivalent to 0. As a result, depending on the combination of the values of input select signals AC and BC (11, 10, 01, or 00), the 2-bit adder outputs 2 bit data A+B, A, B and 0 to sum S0, sum S1, and carry C.

The 2-bit adder 3 is composed of exclusive OR gates EO0 and EO1, a NAND gate NA, an inverted exclusive OR gate EN, an inverter gate INV, and an inverted multiplex gate MX. The exclusive OR gates EO0 and EO1 respectively generate lower sum S0 and lower pre-carry sum P1; the NAND gate NA generates lower inverted carry signal CON; the inverted exclusive OR gate EN generates upper sum S1 from pre-carry sum P1 and inverted carry signal CON; and the inverter gate INV and the inverted multiplex gate MX select either inverted carry signal CON or BZ1N as the inverse of B side upper bit BZ1 (generated by the inverter gate INV) according to the pre-carry sum P1 and invert it to generate carry C.

Figure 14:
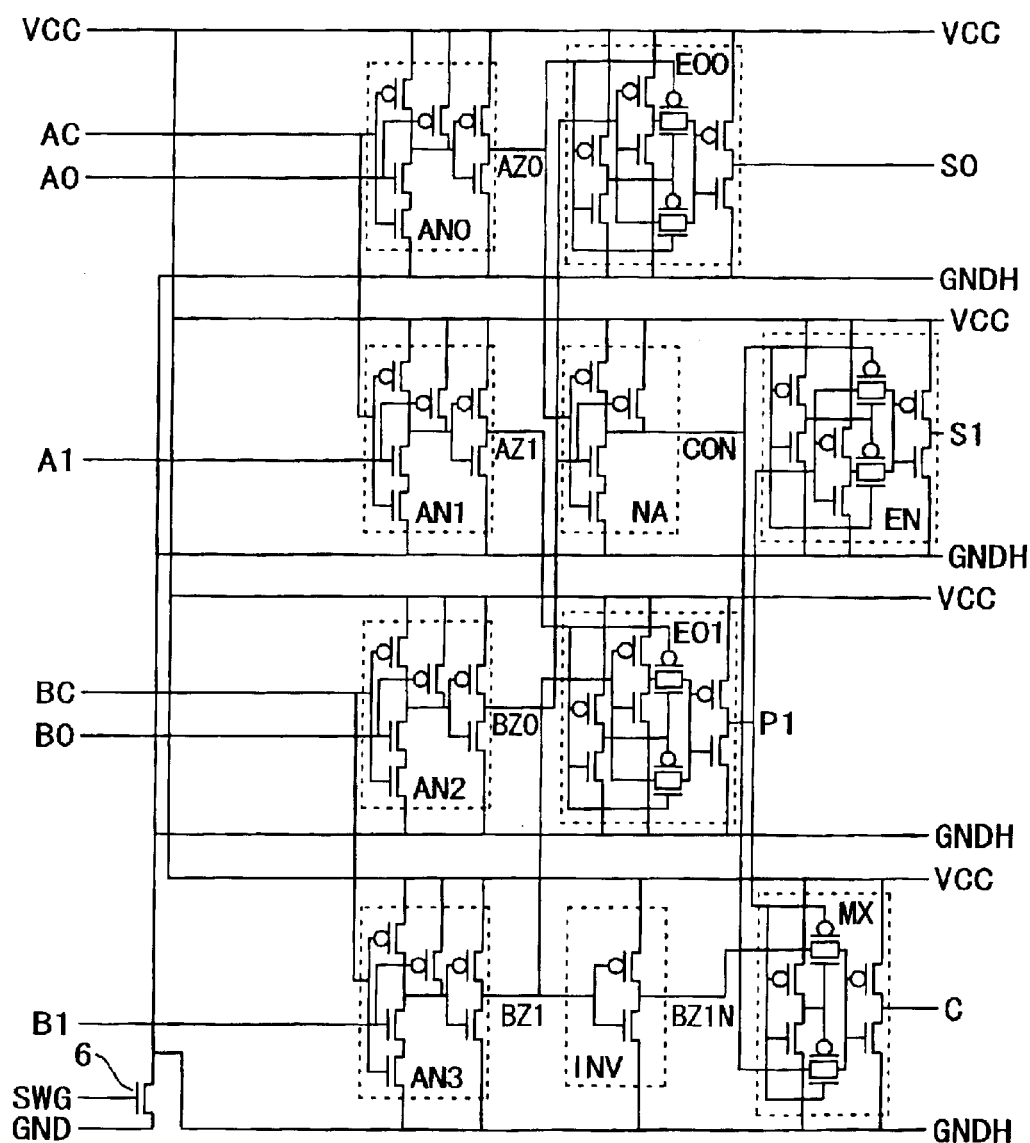
FIG. 14 is a circuit diagram illustrating a logic circuit of the logical configuration shown in FIG. 13.

FIG. 14 is a circuit diagram that concretely illustrates the circuit of the adder shown in FIG. 13. This circuit diagram shows how internal nodes of logical cells and the logical cells are connected with power supply lines. As shown in FIG. 14, the cells are connected with the power supply line VCC and the local ground supply line GNDH. The local ground supply line GNDH is connected with the ground supply line GND through a high-threshold NMOS transistor 6, which is controlled by the first switch control signal SWG. In FIG. 14, the exclusive OR gate EO0 and EO1, and the inverted exclusive OR gate EN, and the inverted multiplex gate MX are structured according to the pass-transistor logic which is based on a transistor pair, which is composed of a PMOS transistor and an NMOS transistor.

FIG. 15 lists possible ordinary statuses in the circuit of the above described 2-bit adder with a function that makes input signal zero. Here, an input node group IN consists of six bits: input select signals AC, BC, input signals A0, A1 on the A side, and input signals B0 and B1 on the B side. The circuit status depends on the combination of potentials of an output node group OUT and an internal node group NODE. As indicated in FIG. 15, there are three output nodes of the output node group OUT and eight internal nodes of the internal node group NODE. Other nodes are omitted in FIG. 15, because they have inverted potentials of these listed nodes. There are 64 different input node combinations (the $6^{th}$ power of 2, or $2^6$) and 25 combinations correspond to circuit statuses as shown in FIG. 15. For a 32-bit or 64-bit adder as used in a typical processor, there should be a huge number of different combinations or circuit statuses. For the inverter chain circuit as mentioned above, there are only two circuit statuses and therefore there is some circuit design latitude. As the number of statuses increases, there is less circuit design latitude.

Figures 16, 17:
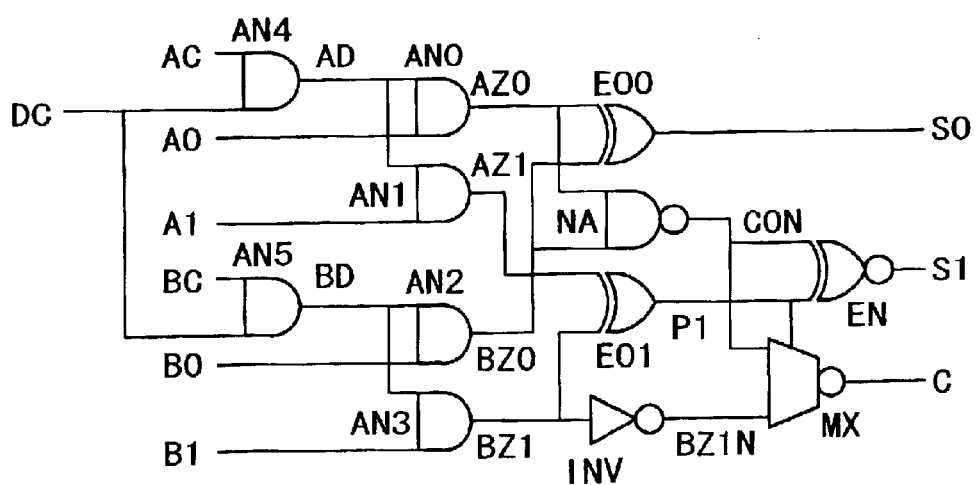
FIG. 16 is a table listing power supply statuses in the logic circuit shown in FIG. 14.
FIG. 17 is a logic diagram illustrating an example of a logical configuration for the logic circuit shown in FIG. 1 according to the present invention.

Power statuses of the adder shown in FIG. 14 are listed in FIG. 16. In this table, * indicates any possible potential; status No.1, 2 or 7 may correspond to any of the 25 statuses of FIG. 15; and status No.3 may correspond to any of the 25 statuses where a node with low potential L is replaced by one with middle potential M.

In this circuit, status transitions take place in the same way as the inverter chain shown in FIG. 4 except that the number of statuses in the operating status NORMAL mode is changed from 2 to 25. Like the case shown in FIG. 4, as the circuit mode changes from the operating status NORMAL mode to the switch-off status OFF mode, there occurs a transition to status No.2, then status No.3, and then status No.4. Here, the first switch control signal SWG becomes low potential L, and therefore, the local ground supply line GNDH and some nodes of the output node group OUT and the internal node group NODE, which were at low potential L, change to middle potential M, then after an adequate time, to high potential H. The nodes that were at high potential H remain high potential H.

Consequently, in status No.3, some nodes are at middle potential M and others at high potential H; in status No.4, all nodes are at high potential H. As the circuit mode changes from the switch-off status OFF mode to the switch-on status ON mode, there occurs a transition to status No.5 then status No.6, and then status No.7. Here, since the first switch control signal SWG becomes high potential H, the local ground supply line GNDH becomes electrically connected with the ground supply line GND and its voltage goes towards low potential L. Since all nodes are at high potential H, all NMOS transistors are conductive so that all nodes go towards low potential L, along with the local ground supply line GNDH.

When a node is not at high potential H, a PMOS transistor which is controlled by it is electrically conductive. Therefore, when all nodes go towards low potential L, the all PMOS transistors become conductive and short-circuit current flows through all nodes. While all nodes are going towards middle potential M, their potentials are sequentially fixed, starting from the input nodes. Once the potentials of all nodes are fixed, short-circuit current stops. Therefore, in order for short-circuit current to fall within the permissible range in the switch-on status ON mode, the potential of the local ground supply line GNDH should go up gradually.

Next, we will explain an adder with input selector according to the present invention, as shown in FIG. 1. The function of selecting a specific status can be implemented by setting input select signals AC and BC to specific values using the control signal for specific status DC.

Generally, application of the present invention requires all input nodes to be set to specific values. On the other hand, it is common that a processor's adder or ALU (Arithmetic and Logic Unit) has an input selector and such an input selector provides options that include constants. Therefore, when only input select signals AC and BC are set to specific values as suggested in this embodiment, the same effect as when all input nodes are set to specific values can be achieved and it is possible to minimize circuit size increase and delay time deterioration. Particularly in an arithmetic unit, it is common for a data system to control delay time, so deterioration in overall delay time can be avoided by adding a circuit to the control system only.

Concretely, this can be achieved as follows: a control gate for specific status 1a, that is an AND gate, is added between the input select signal AC and multiplexer 2a so that the multiplexer 2a selects 0 when the control signal for specific status DC is brought to low potential L. Likewise, regarding the input select signal BC, a control gate for specific status 1b, that is an AND gate, is added between the input select signal BC and the multiplexer 2b.

As a result, when the control signal for specific status DC is at low potential L, the internal and output conditions of this adder reach a specific status. That specific status refers to a status that the multiplexers 2a, 2b output 0 and the adder 3 executes 0+0 and outputs 0 as sum S and carry C.

The power-and-ground line connection schemes as shown in FIGS. 5, 8 and 10 can be applied to this specific status. The method of FIG. 8 is the method of FIG. 5 plus an equalizer for collection of electric charge; namely it is the same as the method of FIG. 5 except the power supply system. Therefore, an explanation is given below of cases that the methods of FIG. 5 and FIG. 10 are applied. To simplify the explanation, a 2-bit adder with a function that makes input signal zero is taken as an example as in the case of the conventional method.

FIG. 17 is a logic diagram showing a 2-bit adder with a function that makes input signal zero, according to the present invention. While the adder of FIG. 1 offers three input options((0,A,X)or (0,B,Y)), this adder offers two input options((A0,A1)or (B0,B1))and input select signals AC and BC are 1-bit signals. Here, an AND gate AN4 as a control gate for specific status 1a, and an AND gate AN5 as a control gate for specific status 1b are added to the circuit shown in FIG. 13. Logical products AD and BD as a result of carrying out the logical product between input select signals AC, BC and the control signal for specific status DC are inputted to the AND gates AN0, AN1, AN2, and AN3. Therefore, when the control signal for specific status DC is set to low potential L, logical products AD and BD are at low potential L regardless of the values of input select signals AC and BC, and adder inputs AZ0, AZ1, BZ0, and BZ1 are at low potential L.

Figure 18:
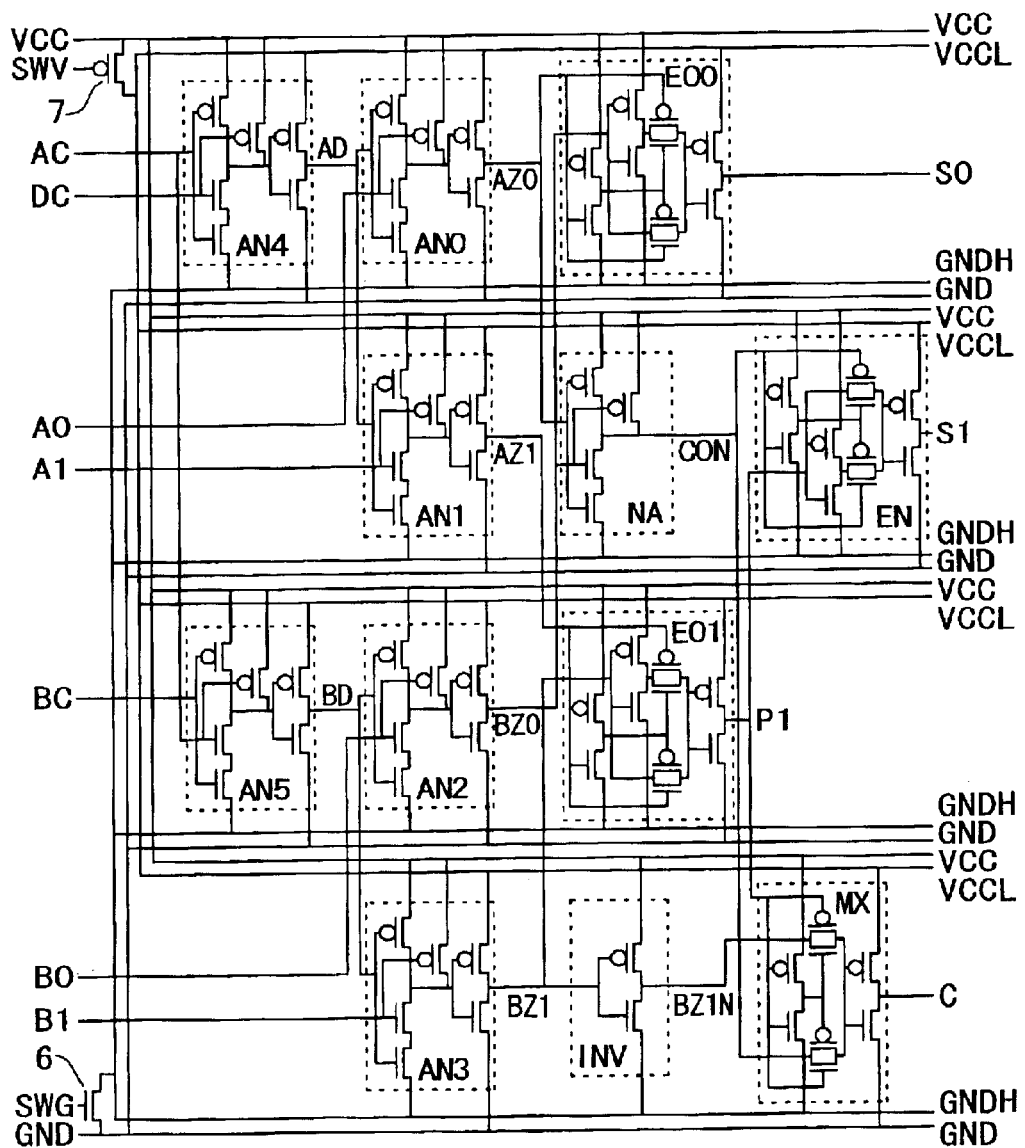
FIG. 18 is a circuit diagram illustrating a first logic circuit of the logical configuration shown in FIG. 17.

FIG. 18 shows a first circuit corresponding to the logic diagram of FIG. 17. This circuit uses the power-and-ground line connection method shown in FIG. 5. First, a local power supply line VCCL is added on the high potential side; this local power supply line VCCL is connected with a power supply line VCC through a high-threshold PMOS transistor 7 which is controlled by second switch control signal SWV. Here, when the control signal for specific status DC is brought to low potential L, the internal node group NODE and output node group OUT become low potential L or high potential H regardless of the potentials of input node group IN.

Let's define nodes with low potential L and MOS transistors for driving them as a low potential group and nodes with high potential H and MOS transistors for driving them as a high potential group. The high potential power terminals in the low potential group are connected to the local power supply line VCCL and the low potential power terminals in the low potential group to the ground supply line GND. The high potential power terminals in the high potential group are connected to the power supply line VCC and the low potential power terminals in the high potential group to the local ground supply line GNDH. How the elements are connected with the supply lines is shown in FIG. 18. Like the case shown in FIG. 14, the exclusive OR gates EO0 and EO1, the inverted exclusive OR gate EN, and the inverted multiplex gate MX are structured according to the pass-transistor logic which is based on a transistor pair, which is composed of a PMOS transistor and an NMOS transistor.

Figure 19:
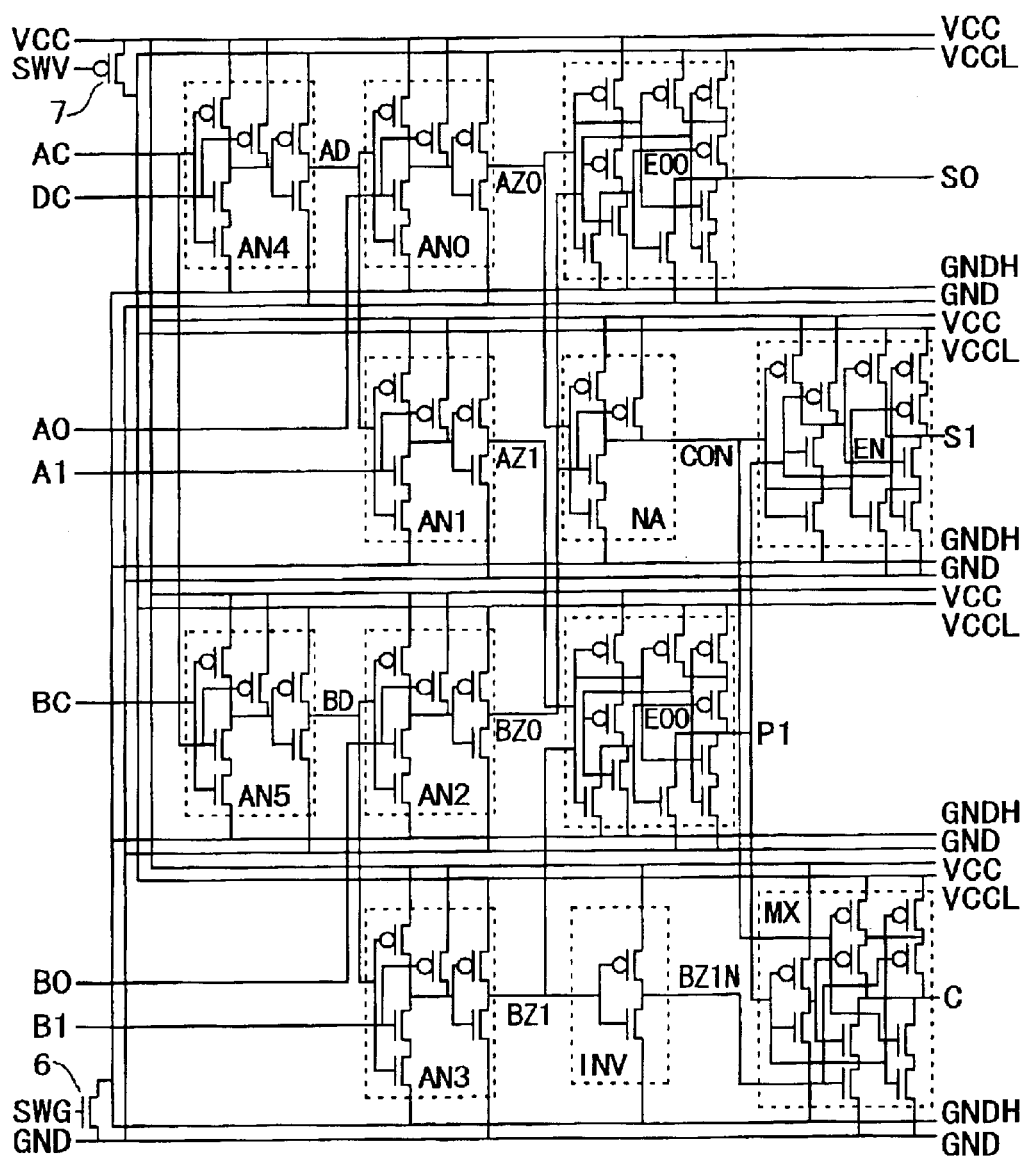
FIG. 19 is a circuit diagram illustrating a second logic circuit of the logical configuration shown in FIG. 17.

FIG. 19 shows a second circuit corresponding to the logic diagram of FIG. 17. Like the first circuit, this circuit uses the power-and-ground line connection method shown in FIG. 5. The difference from the first circuit is that the pass-transistor logic is not employed.

FIG. 20 lists power supply statuses in the first and second circuits. Those shown here are basically similar with those shown in FIG. 6 except that there are more nodes and more operating statuses.

In the operating status NORMAL mode, the first switch control signal SWG and second switch control signal SWV are at high potential H and low potential L respectively; and the local ground supply line GNDH and local power supply line VCCL are electrically connected with the ground supply line GND and power supply line VCC respectively and become low potential L and high potential H respectively. Here, the control signal for specific status DC is at high potential H. Since the potentials of nodes AD and BD are the same as those of nodes AC and BC, this circuit operates in the operating status NORMAL mode in the same way as indicated in the normal status table of FIG. 15, provided that nodes AC and BC in FIG. 15 are replaced by nodes AD and BD in FIG. 20. Like the case in FIG. 14, there are 25 operating statuses in NORMAL mode. In FIG. 20, * indicates any possible potential which the nodes may have and status No.1 represents all possible statuses in this mode.

In the specific status DEFAULT mode, the control signal for specific status DC is at low potential L. As a result, the nodes are uniquely fixed at low potential L or high potential H regardless of the potentials of input nodes IN as shown in status No.2.

In order to help understand the logic, this example adopts a positive logic whenever possible. Therefore, when all adder inputs are made zero by the control signal for specific status DC, many output or internal nodes become low potential L. However, most of the nodes inside the cells are reverse in potential to them and become-high potential H. For the circuit shown in FIG. 18, only one node out of eleven nodes (output and internal nodes) is at high potential H as indicated by status No.2 in FIG. 20. On the other hand, only one node out of the seventeen nodes inside the cells is at low potential L. Therefore, there is no substantial potential bias among all the nodes.

The switch-off status OFF mode should come after the specific status DEFAULT mode. In this OFF mode, the first switch control signal SWG and the second switch control signal SWV become low potential L and high potential H respectively; the local ground supply line GNDH and local power supply line VCCL are disconnected from the ground supply line GND and power supply line VCC, respectively. Just after the disconnection, the potentials of the nodes in the specific status DEFAULT mode are maintained and thus there comes status No.3. Then, status No.3 is followed by status No.4 where the local ground supply line GNDH and local power supply line VCCL are at middle potential M; then, a transition to status No.5 occurs in an adequate time.

Meanwhile, regarding nodes with high potential H, the local ground supply line GNDH is disconnected from the ground supply line GND, so leakage current on the low potential side increases the potential of the local ground supply line GNDH, which decreases the potential difference between the power supply line VCC and the local ground supply line GNDH. This reduces leakage current and the potential of the local ground supply line GNDH increases to middle potential M, then, after an adequate time, to high potential H. In this condition, leakage current stops. The high potential H of the nodes with high potential is maintained as the power supply line VCC compensates for leakage current.

Likewise, regarding nodes with low potential L, the local power supply line VCCL is disconnected from the power supply line VCC, so leakage current on the high potential side decreases the potential of the local power supply line VCCL, which decreases the potential difference between the local power supply line VCCL and the ground supply line GND. This reduces leakage current and the potential of the local power supply line VCCL decreases to middle potential M, then after an adequate time, down to low potential L. In this condition, leakage current stops. The low potential L of the nodes with low potential L is maintained as the ground supply line GND compensates for leakage current.

In the switch-on status ON mode, the first switch control signal SWG and second switch control signal SWV are again at high potential H and low potential L respectively; the local ground supply line GNDH and local power supply line VCCL are electrically connected with the ground supply line GND and power supply line VCC respectively and become low potential L and high potential H respectively.

As a consequence, when the switch-off status No.5 has lasted for a long time, there occurs a transition through status No.6 and status No.7 to status No.2. Meanwhile, the nodes with high potential H are disconnected from the local ground supply line GNDH by NMOS transistors because the nodes which control the NMOS transistors for driving them are at low potential L, and thus remain high potential H. Likewise, the nodes with low potential L are disconnected from the local power supply line VCCL by PMOS transistors because the nodes which control PMOS transistors for driving them are at high potential H, and thus remain low potential L.

If the switch-off status has lasted for a short time and a transition from status No.5 to the switch-on status ON mode has taken place, there follows a transition from status No.8 in the switch-on status ON mode to status No.3 in the specific status DEFAULT mode.

If the switch-off status has lasted only for a very short time and a transition from status No.4 to the switch-on status ON mode has taken place, immediately status No.3 in the specific status DEFAULT mode follows.

After that, as the control signal for specific status DC is returned to high potential H in the specific status DEFAULT mode, status No.1 in the operating status NORMAL mode is restored.

Since the circuit shown in FIG. 18 uses the pass-transistor logic, leakage current, which would stop in an ordinary CMOS, may not stop. For example, in case of the exclusive OR gate EO0, the input potentials of two pass-transistors are reverse to each other. That is, the node BZ0 and its inverted signal are inputted. And the control potentials for the two pass-transistors are also reverse to each other. That is, the node AZ0 and its inverted signal are inputted. Therefore, whatever potential combination the input nodes AZ0 and BZ0 may have, one of the input potentials of the two pass-transistors is reverse to the pass-transistor output potential. In the specific status DEFAULT mode, for example, the pass-transistor output node for the exclusive OR gate EO0 is at high potential H and the one pass-transistor input node is node BZ0 which is at low potential L. Therefore, leakage current continues to flow through this pass-transistor.

However, the path from the power supply line VCC through this pass-transistor to the ground supply line GND includes one PMOS transistor, two PMOS-NMOS transistor pairs, and one NMOS transistor. Therefore, leakage current is even smaller than in an inverter which only has one PMOS transistor and one NMOS transistor in the path from the power supply line VCC to the ground supply line GND. According to the pass-transistor logic, source and drain of pass-transistor are not usually directly connected with supply lines and leakage current is always small as this case suggests.

By contrast, the circuit shown in FIG. 19 does not use the pass-transistor logic. This means that when an adequate time has passed in the switch-off status OFF mode in the circuit in FIG. 19, leakage current should stop.

Figure 21:
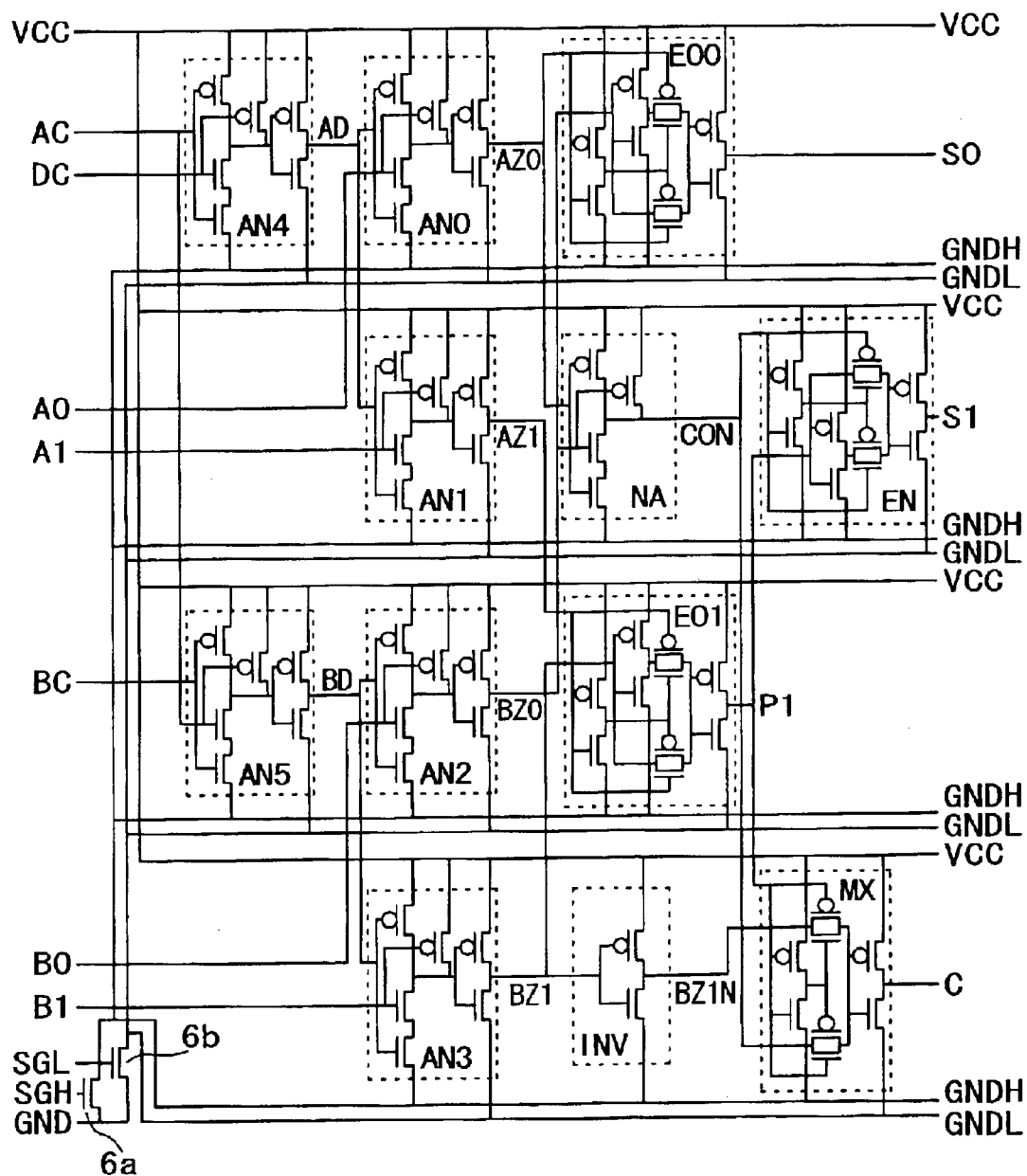
FIG. 21 is a circuit diagram illustrating a third logic circuit of the logical configuration shown in FIG. 17.

Next, FIG. 21 shows a third circuit corresponding to the logic diagram of FIG. 17. The third circuit employs the power-and-ground line connection scheme shown in FIG. 10. There are two local ground supply lines GNDH and GNDL which are connected to the ground supply line GND through high-threshold NMOS transistors 6a and 6b which are controlled by the third and fourth switch control signals SGH and SGL respectively.

In this case, when the control signal for specific status DC is brought to low potential L, internal node group NODE and output node group OUT become low potential L or high potential H regardless of the potentials of input node group IN. Now, let's define nodes with low potential L and MOS transistors for driving them as a low potential group and nodes with high potential H and MOS transistors for driving them as a high potential group. The low potential power terminals in the low and high potential groups are connected to the local power supply lines GNDL and GNDH respectively. The high potential power terminals in both groups are connected to the power supply line VCC.

How the elements are connected with the supply lines is as shown in FIG. 21. Like the case shown in FIG. 14, the exclusive OR gate EO0 and EO1, and the inverted exclusive OR gate EN, and the inverted multiplex gate MX are structured according to the pass-transistor logic which is based on a transistor pair, which consists of a PMOS transistor and an NMOS transistor.

FIG. 22 lists power supply statuses in the circuit shown in FIG. 21. The statuses listed here are basically similar with those in FIG. 11 except that there are more nodes and more operating statuses in NORMAL mode, as the circuit is more complicated.

In the operating status NORMAL mode, the switch control signals SGH and SSL are at high potential H; and the local ground supply lines GNDH and GNDL are electrically connected with the ground supply line GND and become low potential L. The control signal for specific status DC is at high potential H. There are 25 operating statuses in NORMAL mode as in the circuits shown in FIGS.18 and 19.

In the specific status DEFAULT mode, the control signal for specific status DC is at low potential L. As a result, the nodes are uniquely fixed at low potential L or high potential H regardless of the potentials of input nodes IN as shown as status No.2.

The switch-off status OFF mode should come after the specific status DEFAULT mode. In this OFF mode, the switch control signals SGH and SGL become low potential L; and the local ground supply lines GNDH and GNDL are disconnected from the ground supply line GND. Just after the disconnection, the potentials of the nodes in the specific status DEFAULT mode are maintained and thus there comes status No.3. Then, status No.3 is followed by status No.4 where the local ground supply lines GNDH and GNDL are at middle potential M; then, after an adequate time there occurs a transition to status No.5 where all the nodes are at high potential H. Meanwhile, regarding leakage current flowing through nodes with high potential H, since the local ground supply line GNDH is disconnected from the ground supply line GND, the potential of the local ground supply line GNDH rises, which decreases the potential difference between the power supply line VCC and the local ground supply line GNDH. This reduces leakage current. The potential of the local ground supply line GNDH rises to middle potential M, then, after an adequate time, to high potential H, which causes leakage current to stop. The high potential H of the nodes in the high potential group is maintained as the power supply line VCC compensates for leakage current.

On the other hand, due to leakage current, the potentials of the nodes in the low potential group and the low potential local power supply line GNDL rise to middle potential M and then to high potential H. As the potentials rise, the potential difference decreases, which reduces leakage current. As high potential H is reached in an adequate time, leakage current stops. The circuit shown in FIG. 21 uses pass-transistors, but all the nodes become high potential H and leakage current as seen in the circuit in FIG. 18 does not occur.

In the switch-on status ON1 mode, the fourth switch control signal SGL becomes high potential H and the low potential local power supply line GNDL is electrically connected with the ground supply line GND and becomes low potential L. As a consequence, when the switch-off status No.5 has lasted for a long time, there occurs a transition through status No.6, status No.7 to status No.8 in the switch-on status ON1 mode. Meanwhile, the nodes in the high potential group and the local ground supply line GNDH, which are disconnected from the ground supply line GND, remain high potential H. On the other hand, the nodes in the low potential group are disconnected from the power supply line VCC by PMOS transistors which are controlled by the nodes in the high potential group which remain high, and go down to the middle potential M, then to low potential L, along with the local power supply line GNDL.

If the switch-off status has lasted for a short time and a transition from status No.4 to the switch-on status ON1 mode has taken place, there follows a transition in the switch-on status ON1 mode from status No.7 to status No.8. In this case, the nodes in the high potential group and the local ground supply line GNDH remain high-potential H and the nodes in the low potential group go down to middle potential M, then to low potential L, along with the local ground supply line GNDL.

If the switch-off status OFF mode has lasted only for a very short time and a transition from status No.3 to the switch-on status ON mode has taken place, immediately status No.8 follows.

In the switch-on status ON2 mode, the third switch control signal SGH is again at high potential H and the local ground supply line GNDH is electrically connected with the ground supply line GND and goes down to middle potential M, and then to low potential L. In this case, since the local ground supply line GNDH and the nodes in the high potential group are disconnected by the NMOS transistors which are controlled by the nodes in the low potential group which have become low potential L in the switch-on status ON1 mode, the nodes in the high potential group remain high potential H. As a result, a transition occurs from status No.9 to No.10 in the O2 mode, then again to status No.2 in the specific status DEFAULT mode. Then, as the control signal for specific status DC returns to high potential H in the specific status DEFAULT mode, one of the 25 statuses in the operating status NORMAL mode is restored.

The logic of an adder is complicated and diverse as explained so far. According to the present invention, the statuses of all elements can be controlled by switching-off operation after transition to a specific status, and short-circuit current flowing upon switching-on operation can be suppressed and thus the power switch can be turned on quickly. In addition, since an arithmetic unit usually has a function of inputting constants, a few gates may be inserted in a manner which does not affect the delay time, so that the power switch can be quickly turned on.

<Embodiment 2>

Figure 23:
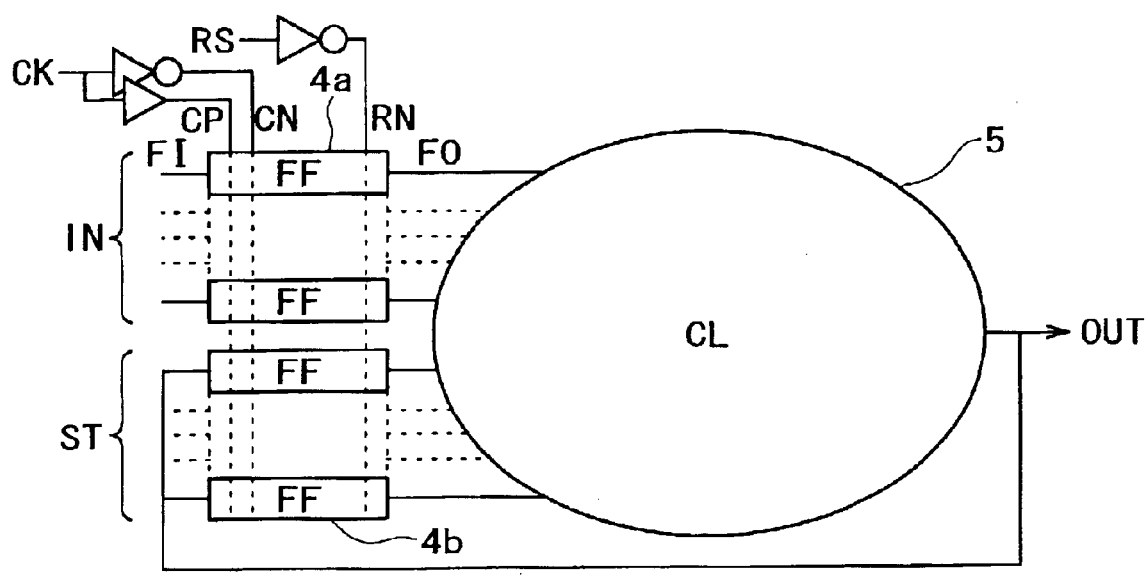
FIG. 23 shows the structure of a logic circuit according to a second embodiment of the present invention.

Next, we will explain how to apply the present invention to a general logic circuit. Generally, a logic circuit includes flip-flops and combination logic circuits. FIG. 23 shows an example which enables the logic circuit to be set to a specific status by using flip-flops with reset.

The logic circuit may be divided as follows in perspective of input nodes for flip-flops FF. As shown in FIG. 23, the logic circuit includes flip-flops FF 4a that receive input signals IN, flip-flops FF 4b that store statuses ST, and a combination logic part 5(CL). The combination logic part 5 includes an illogic or non-wiring part which directly outputs an input.

Figure 24:
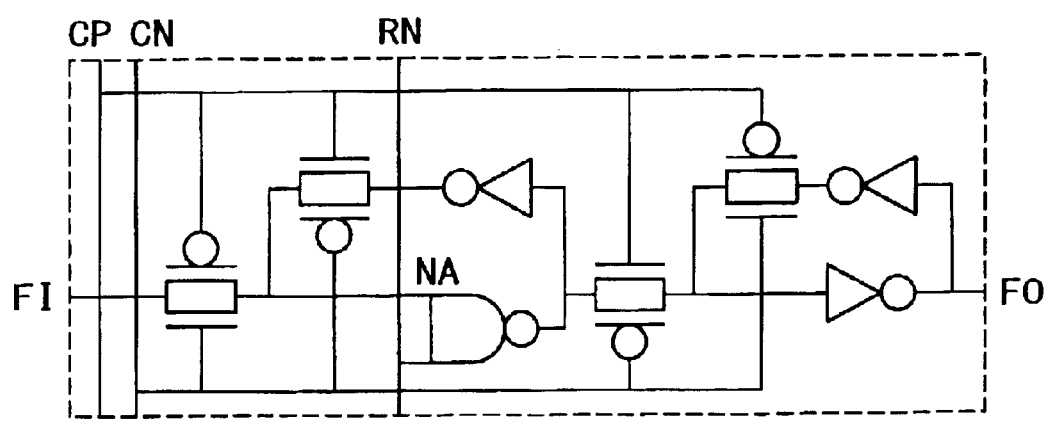
FIG. 24 is a circuit diagram illustrating a flip-flop as used in the logic circuit shown in FIG. 23.

There are many types of flip-flops FF. FIG. 24 illustrates an example of a flip-flop with reset. In normal operation, this flip-flop latches a signal from input terminal FI once in a cycle according to a clock supplied from positive and negative clock terminals CP and CN and outputs its value from an output terminal F0 within one cycle. A negative reset terminal RN is at high potential H in normal operation. A NAND gate NA functions as an inverter in normal operation. When the negative reset terminal RN is set to low potential L, output of the NAND gate NA becomes high potential H. As a result, low potential L is outputted to output terminal F0 through the pass-transistor and the inverter.

The logic circuit shown in FIG. 23 uses flip-flops with reset like the one shown in FIG. 24. The positive and negative clock terminals CP and CN of each flip-flop FF receive a positive clock signal and a negative clock signal which are generated from clock signal CK and the negative reset terminal RN receives an inverted signal from the reset signal RS.

In normal operation, the reset signal RS is at low potential L. Conventionally, the reset signal RS has been used to initialize the logic circuit. In the present invention, it is also used when the power switch is turned off. The status of the logic circuit can be uniquely fixed by bringing the reset signal RS to high potential H before turning off the power switch. Consequently, the logic circuit may be divided into a high potential group and a low potential group, which are connected to the corresponding supply lines. Thus, short-circuit current flowing upon switching-on operation can be suppressed.

Figure 25:
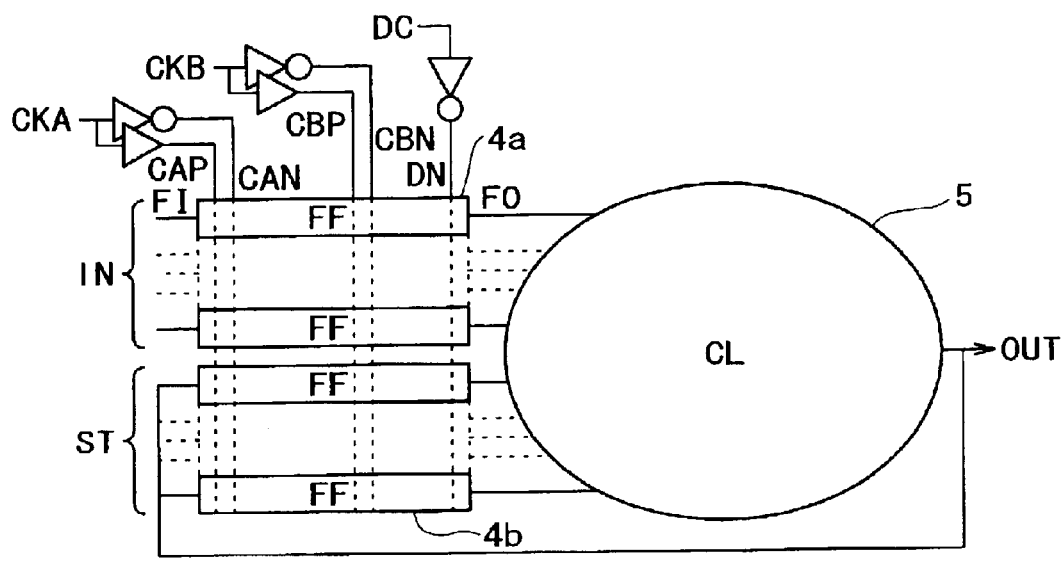
FIG. 25 shows the structure of a variation of the logic circuit according to the second embodiment of the present invention.
Figure 26:
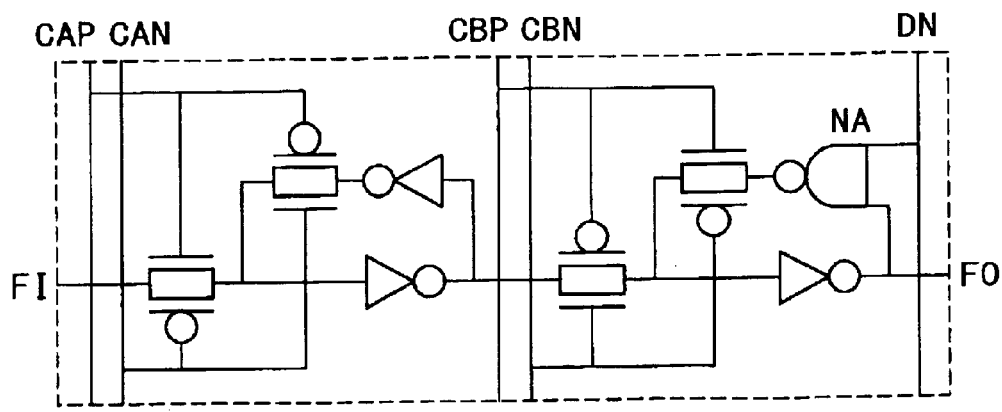
FIG. 26 is a circuit diagram illustrating a first flip-flop as used in the logic circuit shown in FIG. 25.

FIG. 25 shows an example that enables the logic circuit to be set to a specific status by using a flip-flop with a function of output signal negation. In this case, the flip-flops with reset in the circuit of FIG. 23 are replaced by flip-flops with a function of output signal negation. The flip-flops with a function of output signal negation use a circuit as shown in FIG. 26. In turning off the power switch, the flip-flop output is brought to low potential L in order to set the logic circuit to a specific status so that the circuit may be divided into a high potential group and a low potential group. The high and low potential groups are connected to the corresponding supply lines so that short-circuit current flowing upon switching-on operation can be suppressed.

FIG. 26 shows a first example of a flip-flop with a function of output signal negation. The feedback inverter in the latter stage of a master-slave type flip-flop is replaced by a NAND gate NA and a negative control signal for specific status DN is connected to input of the NAND gate NA. The negative control signal for specific status DN is at high potential in normal operation, and at low potential when the potential of the output node F0 should be low. In this flip-flop, there is an independent clock system in each of the former stage and the latter stage. This reason is as follows; in the latter stage, the feedback side must be chosen in order to convey a specific status to the output terminal F0. At the same time, in the former stage, the feedback side also must be chosen in order to maintain the status. This does not occur in normal operation, in which the input side and the feedback side are chosen alternately in the former and latter stages. Therefore, the clock system is made independent between the former stage and the feedback stage and both stages are set to the feedback side at the time of specific status output. In this way, this flip-flop can have both the function of maintaining a status (a function proper to a flip-flop) and the function of output signal negation.

Figure 27:
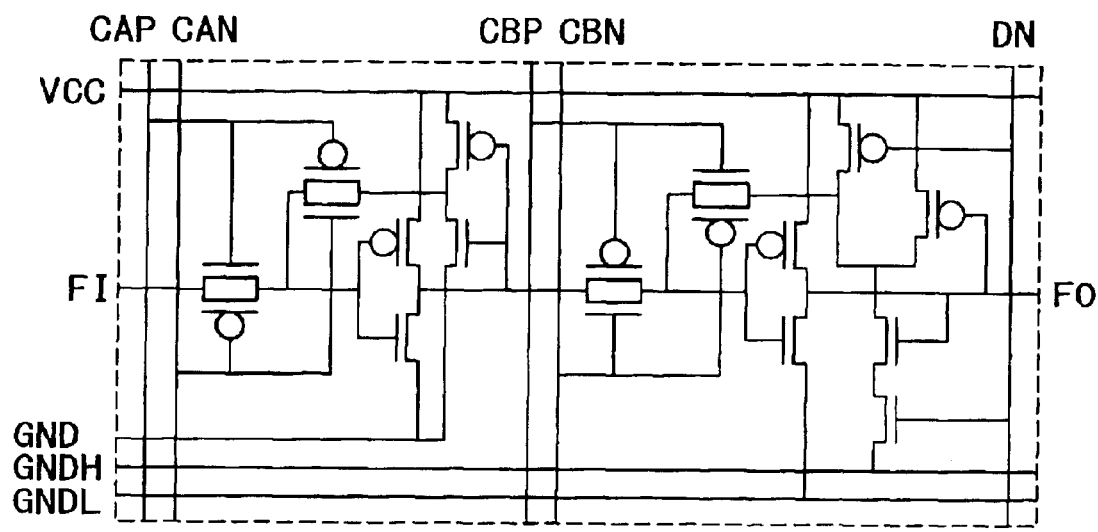
FIG. 27 is a circuit diagram illustrating a first flip-flop as used in the logic circuit shown in FIG. 25.

FIG. 27 shows a circuit corresponding to the logic diagram of FIG. 26. It uses the same power-and-ground line connection method as used in the inverter chain shown in FIG. 10. In this case, however, the two inverters in the former stage are directly connected with the ground supply line GND so as to maintain a status while the power switch is off. Since these inverters drive the internal nodes, the drive capability required for them is not as high as that for the latter stage; therefore they may be composed of high-threshold MOS transistors so that leakage current is suppressed while the status is being maintained.

If the drive capability of the former stage is a matter of concern, there should be a double inverter system that receives input signals. One should be composed of low-threshold MOS transistors exclusively designed to drive the latter stage, with its low potential side terminal connected to the local ground supply line GNDH; and the other should be composed of high-threshold MOS transistors exclusively designed to drive the feedback inverter, and be directly connected to the ground supply line GND.

Again referring to FIG. 25, the flip-flop FF control circuit is explained below. It includes two clock systems. As clocks CKA and CKB are inputted, positive and negative clock signals generated from these are fed to four clock terminals CAP, CBP, CAN and CBN of each flip-flop FF. A negative control signal for specific status DN is generated from a control signal for specific status DC and the signal DN is fed to each flip-flop FF. In normal operation, the control signal for specific status DC is at low potential L and the same clock signal is sent to clocks CKA and CKB.

Before turning off the power switch MOS, clock CKA is stopped at low potential L, clock CKB stopped at high potential H and the control signal for specific status DC is set to high potential H so that a status in the former stage is maintained and a low potential L is outputted in the latter stage. This causes the logic circuit to enter on a specific status which is maintained while the switch is off. Therefore, when the switch is turned on, short-circuit current is suppressed. After turning on the switch, the clock CKB is issued at first to output the status held in the former stage.

Figure 28:
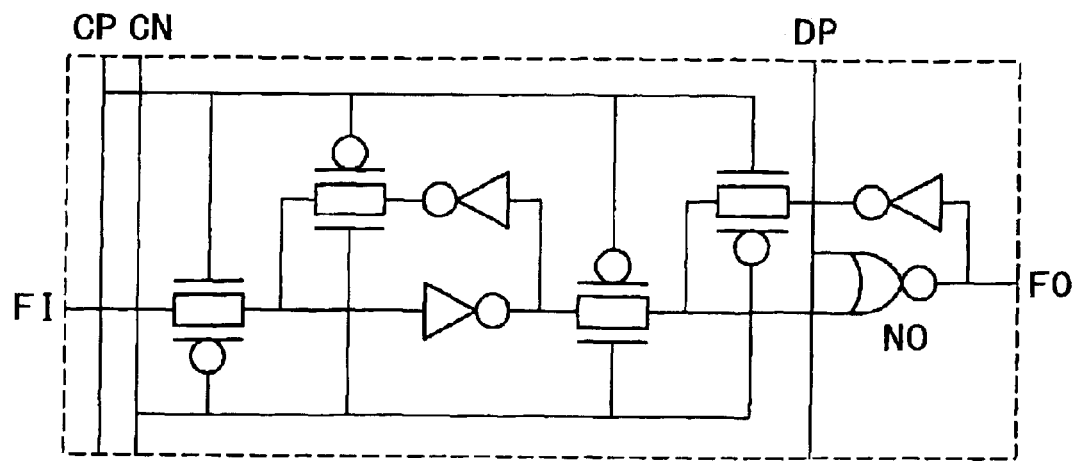
FIG. 28 is a circuit diagram illustrating a second flip-flop as used in the logic circuit.

FIG. 28 shows a second example of a flip-flop with a function of output signal negation. The output inverter of a master-slave type flip-flop is replaced by a NOR gate NO and a positive control signal for specific status DP is connected with input of the NOR gate NO. The positive control signal for specific status DP is at low potential L in normal operation, and at high potential H when the potential of the output of the flip-flop is low potential L. Even when the potential of the output is low potential L, the state is maintained in the latch of the former stage, so this flip-flop has both the function of maintaining the status and the function of setting output signal to a specific status.

Since there is no need to have two clock systems, the circuit structure is simpler than in the first example. The NOR gate NO is used instead of the output inverter and thus the load drive capability of this flip-flop is lower than the first example. However, since the proportion of flip-flops on a path critical to delay time is low, there is little problem even when flip-flops of this type are mostly used.

Figure 29:
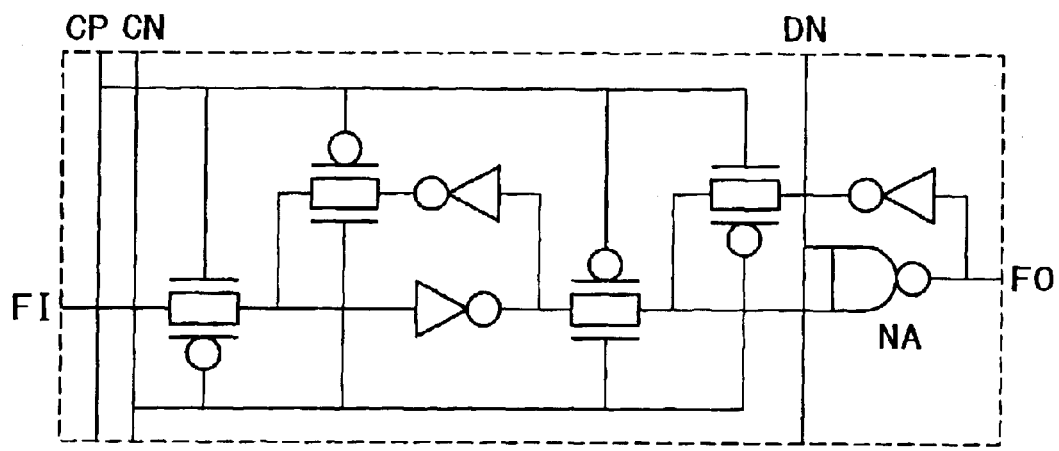
FIG. 29 is a circuit diagram illustrating a third flip-flop as used in the logic circuit.

FIG. 29 shows an example of a flip-flop with a function of output signal assertion. The output inverter of a master-slave type flip-flop is replaced by a NAND gate NA and a negative control signal for specific status DN is connected with input of the NAND gate NA. The negative control signal for specific status DN is at high potential H in normal operation, and at low potential when the potential of output of the flip-flop is high potential. Like the flip-flop shown in FIG. 28, this flip-flop has both the function of maintaining a status and the function of setting output signal to a specific status. The drive capability is lower as the second example.

By using flip-flops as shown in FIGS. 28 and 29, flip-flop output can be made a desired potential combination. The circuit shown in FIG. 26 can also be made a circuit for high potential output by using an NOR gate instead of a NAND gate.

As explained above, by using specially designed flip-flops, the present invention can be applied to a general logic circuit without the need for modifying the combination logic or increasing the number of logic stages.

<Embodiment 3>

Figure 30:
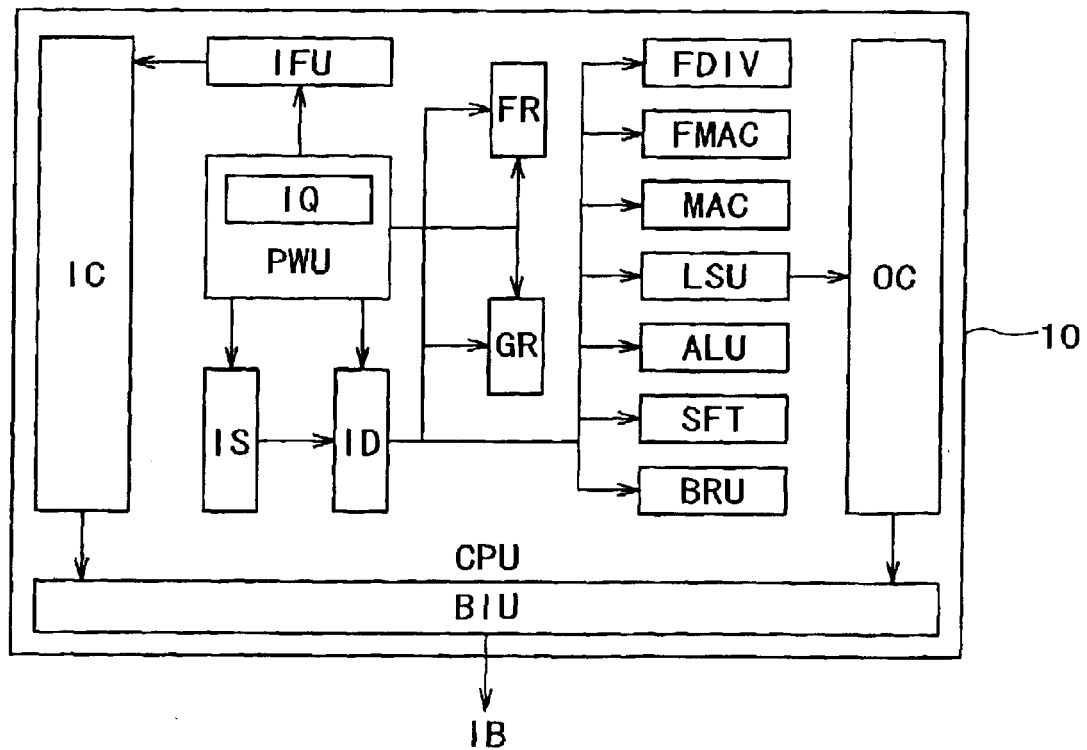
FIG. 30 shows the structure of a processor core according to a third embodiment of the present invention.

FIG. 30 shows an example of a processor core according to the present invention. The processor core 10 includes arithmetic unit type circuit for data processing and a control system logic circuit. Both the arithmetic unit type circuit and the control system logic circuit can be so configured as to suppress short-circuit current upon turning on the power switch MOS, as in the logic circuit as explained in connection with the second embodiment. In other words, it is possible to suppress short-circuit current in both the arithmetic unit type circuit and the logic circuit when the power switch MOS is turned on. The number of cycles required for turning on the power switch MOS is one cycle (one clock cycle) to several cycles or so.

The processor core 10 operates based on a pipeline scheme; generally, data must flow in a pipeline successively while control signals can be sometimes skipped. In particular, concerning control signals for turning on the power switch MOS, it is desirable to determine when to use a specific pipeline stage as many cycles in advance as necessary for turning it on.

First of all, we will explain the constituent parts of the processor core 10 and its control sequence, referring to FIG. 30. It is composed of an instruction cache IC, an instruction fetch unit IFU, a power control unit PWU, an instruction issue unit IS, an instruction decoder ID, a general register file GR and a floating-point register file FR, seven execution units, namely a floating-point divider FDIV, a floating-point multiply-accumulator FMAC, an integer multiply-accumulator MAC, a load store unit LSU, an arithmetic logical unit ALU, a shifter SFT, a branch unit BRU, an operand cache OC, and a bus interface unit BIU. The power control unit PWU has an instruction queue IQ for queuing instructions to be executed.

The power control unit PWU predicts or decides the type of instruction by partially pre-decoding the instruction queue IQ. Usually the control sequence is as follows: an instruction is sent from the instruction queue IQ in the power control unit PWU to the instruction issue unit IS where a decision is made as to which unit has issued the instruction and whether the issue is acceptable or not; then it is sent to the instruction decoder ID where it is decoded and a control signal is generated to activate the general register file GR and floating-point register file FR, and seven execution units. Each unit finishes its process in one or several cycles.

The load store unit LSU accesses the operand cache OC for load storage.

The power control unit PWU manages the condition of the instruction queue IQ and requests the instruction fetch unit IFU to fetch an instruction if some space becomes available in the instruction queue IQ or if it becomes necessary to fetch a new instruction due to branching.

The instruction fetch unit IFU accesses the instruction cache IC to fetch an instruction. If the instruction cache IC or operand cache OC makes a miss, a request is made to the bus interface unit BIU to fetch an instruction or operand from outside the processor core.

For the above control sequence, the power switch can be turned on only when necessary by sending a power switch-on control signal as many cycles in advance as necessary for turning it on. In the explanation given below, it is assumed that the number of cycles necessary for turning on the power switch MOS is 2.

The power control unit PWU sends an instruction to the instruction issue unit IS and, at the same time, specifies the register file to be used for the instruction, and if necessary, gives the general register file GR and floating-point register file FR an instruction to turn on the power switch MOS. In the next cycle, it specifies one of the seven execution units that is to be used by that instruction and gives that unit an instruction to turn on the power switch MOS.

For an execution unit which has a multi-cycle pipeline structure, the above-said instruction to turn on the power switch flows along the pipeline and power switch MOSs are turned on successively. Since operation of the operand cache OC is integrated into pipeline operation of the load store unit LSU, an instruction to turn on the power switch MOS is issued similarly.

Depending on the condition of the instruction queue IQ, the power control unit PWU starts the instruction fetch unit IFU two cycles before it becomes necessary to fetch an instruction, then in the next cycle, starts the instruction cache IC. If the instruction cache IC or operand cache OC makes a cache miss, an instruction is given to turn on the power switch MOS for the bus interface unit BIU. When the instruction queue IQ becomes empty, the instruction issue unit IS and instruction decoder ID power switch MOSs may be turned off, on the condition that these units are started two cycles or one cycle before arrival of the instruction.

During a long-latency waiting period for execution of an instruction or in occurrence of a cache miss, the power switch MOSs of unrequired units may be once turned off, on the condition that an instruction to turn on them is issued two cycles before the end of execution or completion of a fetch from outside.

When only the power switch MOSs of required units are turned on in a timely manner depending on the execution condition of the processor core 10, power consumption due to leakage current is reduced and thus power saving is achieved.

FIG. 31 shows an example of a processor according to the present invention. In the processor 11, a processor core (CPU) 10, an external memory interface EMI, a direct memory access controller DMAC, and a peripheral bus bridge IPBR are interconnected through an internal bus IB; and the peripheral bus bridge IPBR and peripheral modules IP1, IP2 and IP3 are interconnected through a peripheral module bus IPB. The external memory interface EMI outputs external address A and exchanges data D with the outside device of the processor 11.

As in the logic circuit according to the second embodiment, each of these modules can be configured so that short-circuit current is suppressed when the power switch MOS is turned on. Therefore, according to the present invention, the power switch MOSs in the processor 11 can be turned on and off in a timely manner with suppressed short-circuit current.

For example, the processor core 10 can issue a required module an instruction to turn on the power switch MOS while a bus arbiter is making an arbitration for the internal bus IB or peripheral module bus IPB, so that only the power switch MOS of the required module is turned on. Alternatively, it is possible to turn on the power switch MOS just in time through advance power control operation as done inside the processor core 10.

According to the present invention, short-circuit current upon turning on a power switch MOS is suppressed, and the power switch can be quickly turned on. Consequently, the power switch can be turned on and off in a timely manner and thus the power-on duration can be minimized and power consumption by the circuit can be reduced. The invention can solve the following problems inherent to conventional circuits: the time to use a module must be predicted a considerable time ahead; the power switch MOS must stay on at the expense of power consumption; or the power switch MOS must be turned on just when it is time to use the module and there is thus a considerable waiting time for the power switch MOS to turn on actually. It can solve these problems by starting the module one or several cycles in advance according to fixed data or accurate prediction. It makes such prediction easier, enables prediction by hardware, and allows the power switch MOS to be turned on and off in a more timely manner without any sacrifice of performance.

One of ordinary skill in the art would be enables by such description to make various modifications to the preferred embodiments and still be within the scope and spirit of the present invention as defined in the appended claims.

What is claimed is:

1. A logic circuit comprising:
   a first supply line to be supplied with a first potential;
   a first local supply line;
   a first switch between the first supply line and the first local supply line;
   a second supply line to be supplied with a second potential;
   a second local supply line;
   a second switch between the second supply line and the second local supply line;
   a first logic gate receiving a state control signal and an input signal, an output of the first logic gate being at the first potential when the state control signal is a first state regardless of a state of the input signal; and
   a plurality of second logic gates including a first-type second logic gate and a second-type second logic gate, an output of the first-type second logic gate being at the first potential and an output of the second-type second logic gate being at the second potential the state control signal is the first state, wherein the first-type second logic gate is connected to the first supply line and the second local supply line;

wherein the second-type second logic gate is connected to the first local supply line and the second supply line; and wherein the state control signal is the first state when the first and second switches are in an OFF state, and the state control signal changes from the first state to a second state after the first and second switches change from the OFF state to an ON state.

2. The logic circuit according to claim 1, further comprising:

a third switch between the first local supply line and the second local supply line; and a diode connected to the third switch in series between the first local supply line and the second local supply line;

wherein a cathode of the diode is connected to a higher potential point than, an anode of the diode.

3. The logic circuit according to claim 2, wherein the third switch is controlled to be in an ON state when a potential difference between the first supply line and the first local supply line is larger than a potential difference between the second supply line and the first local supply line.

4. The logic circuit according to claim 1, wherein the first logic gate has two input nodes, one of the input nodes receiving the state control, signal and another of the input nodes receiving the input signal; and wherein the potential of the output of the first logic gate is determined according to the state of the input signal when the state control signal is the second state.

5. The logic circuit according to claim 1, wherein the state control signal changes from the second state to the first state before the first and second switches change from the ON state to the OFF state.

6. The logic circuit according to claim 1, wherein the first logic gate is connected to the first supply line and the second local supply line.

7. The logic circuit according to claim 1, wherein the first and second switches are insulated gate field effect transistors.

8. The logic circuit according to claim 1, wherein the logic circuit includes an adder and a multiplexer which selects a value to be transferred to the adder; and wherein the first logic gate lets the multiplexer select a constant.

9. A logic circuit comprising:

a first supply line to be supplied with a first potential, a second supply line to be supplied with a second potential;

a first local supply line;

a second local supply line;

a first switch between the second supply line and the first local supply line;

a second switch between the second supply line and the second local supply line;

a first logic gate receiving a state control signal and an input signal, an output of the first logic gate being at the first potential when the state control signal is a first state regardless of a state of the input signal; and a plurality of second logic gates including a first-type second logic gate and a second-type second logic gate;

wherein an output of the first-type second logic gate is at the first potential and an output of the second-type second logic gate is at the second potential in an operating mode in which a potential of the output of the first logic gate is the first potential;

wherein the first-type second logic gate is connected to the first supply line and the first local supply line, and the second-type second logic gate is connected to the first supply line and the second local supply line.

10. The logic circuit according to claim 9, wherein the state control signal is the first state when the first and second switches are in an OFF state, wherein the first switch changes from the OFF state to an ON state after the second switch changes from the OFF state to the ON state, and wherein the state control signal changes from the first state to a second state after the first and second switches are in the ON state.

11. The logic circuit according to claim 9, wherein the first logic gate has two input nodes, one of the input nodes receiving the state control signal and another of the input nodes receiving the input signal; and wherein the potential of the output of the first logic gate is determined according to the state of the input signal when the state control signal is the second state.

12. The logic circuit according to claim 9, wherein the state control signal changes from the second state to the first state before the first and second switches change from the ON state to the OFF state.

13. The logic circuit according to claim 9, wherein the first logic gate is connected to the first supply line and the first local supply line.

14. The logic circuit according to claim 9, wherein the first and second switches are insulated gate field effect transistors.

15. The logic circuit according to claim 9, wherein the logic circuit includes an adder and a multiplexer which selects a value to be transferred to the adder; and wherein the first logic gate lets the multiplexer select a constant.

16. A logic circuit comprising:

a first potential point to be supplied with a first potential;

a second potential point to be supplied with a second potential, a supply voltage being defined by the first and second potential;

a first logic gate, having first and second potential nodes, which receives a state control signal and an input signal;

a plurality of second logic gates each having third and fourth potential nodes; and a plurality of third logic gates each having fifth and sixth potential nodes, each of which is inputted from at least one of the output of the first and second logic gates and outputs to at least one of the second logic gates;

wherein the first and third potential nodes are connected to the first potential point;

wherein an output of the first logic gate is at the first potential when the state control signal is a first state regardless of a state of the input signal, and an output of the second logic gate is at the first potential and an output of the third logic gate is at the second potential when the supply voltage is supplied to the first, second and third logic gates, in an operating mode in which a potential of the output of the first logic gate is the first potential;

wherein the state control signal is the first state when the supply voltage is not supplied to the first, second and third logic gates;

wherein the sixth potential node is controlled to the second potential at least before the fourth potential node is controlled to the second potential; and wherein the state control signal changes from the first state to a second state after the fifth potential node is controlled no the first potential and the fourth potential node is controlled to the second potential.

17. The logic circuit according to claim 16, wherein the sixth potential node is connected to the second potential point.

18. The logic circuit according to claim 17, further comprising:
   a first switch between the first potential point and the fifth potential node; and
   a second switch between the second potential point and the second and fourth potential nodes;
   wherein a potential of the fifth potential node is controlled by the first; switch and potentials of the second and fourth potential nodes are controlled by the second switch.

19. The logic circuit according to claim 16, further comprising:
   a third switch between the second potential point and the second and fourth potential nodes;
   a fourth switch between the second potential point and the sixth potential node;
   wherein a potential of the sixth potential node is controlled by the fourth switch and potentials of the second and fourth potential nodes are controlled by the third switch.

20. The logic circuit according to claim 19, wherein the fifth potential node is connected to the first potential point.

* * * * *